USO08350054B2

(12) United States Patent
Mae et al.

(10) Patent No.: US 8,350,054 B2
(45) Date of Patent: Jan. 8, 2013

(54) OPTICAL FILTER

(75) Inventors: Yukiko Mae, Tokyo (JP); Mitsuhiro Okada, Tokyo (JP)

(73) Assignee: Adeka Corporation, Tokyo (JP)

( * ) Notice: Subject to any disclaimer, the term of this patent is extended or adjusted under 35 U.S.C. 154(b) by 62 days.

(21) Appl. No.: 13/003,442

(22) PCT Filed: Jun. 30, 2010

(86) PCT No.: PCT/JP2010/061197
§ 371 (c)(1),
(2), (4) Date: Jan. 10, 2011

(87) PCT Pub. No.: WO2011/010537
PCT Pub. Date: Jan. 27, 2011

(65) Prior Publication Data
US 2011/0152538 A1 Jun. 23, 2011

(30) Foreign Application Priority Data

Jul. 23, 2009 (JP) .................................. 2009-172369

(51) Int. Cl.
*C07D 209/56* (2006.01)
*H01J 5/16* (2006.01)
(52) U.S. Cl. ........................................ 548/437; 250/226
(58) Field of Classification Search ........................ None
See application file for complete search history.

(56) References Cited

U.S. PATENT DOCUMENTS

| 3,853,911 | A | 12/1974 | Schefczik |
| 2008/0076188 | A1 | 3/2008 | Patsenker et al. |
| 2009/0247406 | A1 | 10/2009 | De Corte et al. |

FOREIGN PATENT DOCUMENTS

| JP | 2004-335415 | 11/2004 |
| JP | 2005-323590 | 11/2005 |
| JP | 2006-303033 | 11/2006 |
| JP | 2007-135583 | 6/2007 |
| JP | 2009-221266 | 10/2009 |

OTHER PUBLICATIONS

Japanese Official Action—200880002974.6—Jan. 27, 2011.
International Search Report, PCT/JP2010/061197, Sep. 21, 2010.

*Primary Examiner* — Kamal Saeed
*Assistant Examiner* — Nyeemah A Grazier
(74) *Attorney, Agent, or Firm* — Young & Thompson

(57) ABSTRACT

An optical filter containing at least one naphtholactam derivative represented by general formula (I), wherein X is oxygen or sulfur; $R^1$, $R^2$, $R^3$, $R^4$, $R^5$, $R^6$, and Y are each hydrogen, halogen, nitro, cyano, aldehyde, carboxyl, hydroxyl, —NRR', organosilyl, optionally substituted C1-C30 alkyl, optionally substituted C6-C30 aryl, or optionally substituted C7-C30 arylalkyl; and R and R' are each hydrogen, optionally substituted C1-C30 alkyl, or optionally substituted C6-C30 aryl.

(I)

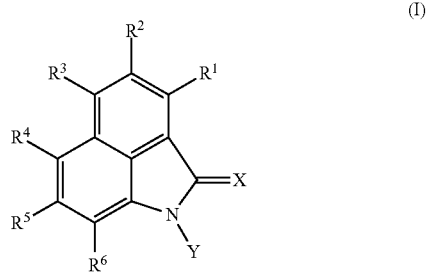

20 Claims, 1 Drawing Sheet

OPTICAL FILTER

TECHNICAL FIELD

This invention relates to an optical filter containing a naphtholactam derivative having a specific structure, particularly an optical filter enabling high definition, high brightness, and high efficiency multicolor display and enjoying good productivity. The invention also relates to an optical filter containing the naphtholactam derivative which is a color conversion filter capable of wavelength conversion. The optical filter of the invention is useful in applications to display devices, such as liquid crystal displays (LCDs), plasma display panels (PDPs), and organic electroluminescent (EL) devices; display panels of image sensors, personal computers, word processors, audio equipment, video equipment, car navigation systems, phones, personal digital assistants, and industrial instruments; photoelectric devices, such as solar cells; lighting equipment, such as fluorescent lamps, light emitting diodes (LEDs), and EL lamps; colorant lasers; and copy protect systems.

BACKGROUND ART

Compounds having an absorption in the visible light region are used as an optical element in optical filters for application to image display devices, such as LCDs, PDPs, EL displays, cathode ray tube displays (CRTs), vacuum fluorescent displays, and field emission displays.

Materials that absorb energy to excite electrons and emit electromagnetic radiation as extra energy when the excited electrons return to the ground state exhibit wavelength conversion performance based on the difference of energy between absorption and emission and have been used as a color (or wavelength) converting colorant in dye or pigment formulations, optical filters, agricultural filters, and the like. In particular, organic compounds of such materials have been studied extensively because they have more easily controllable absorption and emission wavelengths than inorganic compounds. Among them, compounds that emit absorbed energy as fluorescence are called fluorescent colorants. Of the fluorescent colorants those emitting visible fluorescence are of high utility and have found application in displays, lighting equipment, such as fluorescent lamps, biological or medical markers, and so on.

An optical filter containing a color conversion colorant, i.e., a wavelength conversion filter is required to have high light resistance in view of its application. When it is applied to image display devices or solar cells, it is desirable that the wavelength after conversion be in the visible region. A color conversion filter achieving a large Stokes shift has been awaited because of its capability of converting light in the UV region, which is unable to be utilized by known color conversion filters, to visible light.

Patent documents 1 to 3 shown below disclose a naphtholactam derivative as a compound useful for wavelength conversion. According to patent documents 1 to 3, however, it is only necessary for the compound for the applications described to be capable of emitting fluorescence, and there is no mention that the naphtholactam derivative is particularly superior. Patent document 4 below discloses a photoelectric device (solar cell module) using a color converting material.

PRIOR ART DOCUMENTS

Patent Documents

Patent document 1: JP 2005-323590A
Patent document 2: JP 2007-135583A
Patent document 3: US 2009/247406A1
Patent document 4: JP 2006-303033A

SUMMARY OF THE INVENTION

Problem to be Solved by the Invention

An object of the invention is to provide an optical filter having high light resistance. Another object of the invention is to provide a color conversion filter having high light resistance and exhibiting wavelength conversion performance with a large Stokes shift while emitting fluorescence. Still another object of the invention is to provide a color-converting light-emitting device and a photoelectric device each having the color conversion filter.

Means for Solving the Problem

As a result of extensive investigations, the present inventors have found that an optical filter containing a naphtholactam derivative having a specific structure has excellent light resistance, that a color conversion filter containing the naphtholactam derivative and having color conversion performance with fluorescence emission achieves a large Stokes shift, and that the above objects of the invention are accomplished by using the optical filter and the color conversion filter.

The present invention has been completed based on the above findings. The invention provides an optical filter containing at least one naphtholactam derivative represented by general formula (I) shown below and a color conversion filter which is the optical filter of the invention and has wavelength conversion performance.

[Chemical Formula 1]

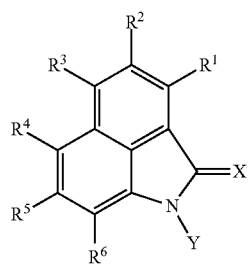

(I)

wherein X represents an oxygen atom or a sulfur atom;
$R^1$, $R^2$, $R^3$, $R^4$, $R^5$, $R^6$, and Y each independently represent a hydrogen atom, a halogen atom, a nitro group, a cyano group, an aldehyde group, a carboxyl group, a hydroxyl group, —NRR', an organosilyl group, an optionally substituted alkyl group having 1 to 30 carbon atoms, an optionally substituted aryl group having 6 to 30 carbon atoms, or an optionally substituted arylalkyl group having 7 to 30 carbon atoms; the methylene chain of the alkyl group, the methylene chain of the arylalkyl group, and the bond between the aryl group and the naphtholactam structure is optionally interrupted by —O—, —S—, —SO$_2$—, —CO—, —OCO—, or —COO—; the methylene chain may be —CH=CH— or —C≡C—; and R and R' each independently represent a hydrogen atom, an optionally substituted alkyl group having 1 to 30 carbon atoms, or an optionally substituted aryl group having 6 to 30 carbon atoms.

The color-converting light-emitting device of the invention includes a light emitting portion and the optical filter of the invention which is a color conversion filter having wavelength conversion performance.

The photoelectric device of the invention includes a photoelectric element and the optical filter of the invention which is a color conversion filter having wavelength conversion performance.

Effect of the Invention

The optical filter of the invention containing the naphtholactam derivative is excellent in light resistance and suited for application to high color purity image displays. The optical filter of the invention which is a color conversion filter having wavelength conversion capability has excellent light resistance, achieves a large Stokes shift, and is suitable to application to color-converting light-emitting devices and photoelectric devices.

BEST MODE FOR CARRYING OUT THE INVENTION

Figure 1A:
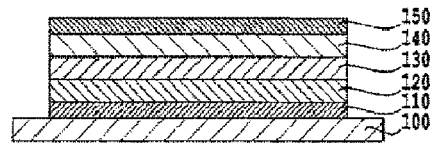
FIG. 1(a) is a cross-section of a preferred embodiment of the optical filter according to the invention.

The optical filter containing the naphtholactam derivative, color conversion filter, color-converting light-emitting device, and photoelectric device according to the invention will be described in detail with reference to their preferred embodiments.

Examples of the halogen atom as represented by $R^1$, $R^2$, $R^3$, $R^4$, $R^5$, $R^6$, and Y in general formula (I) include fluorine, chlorine, bromine, and iodine. Examples of the organosilyl group as represented by $R^1$, $R^2$, $R^3$, $R^4$, $R^5$, $R^6$, and Y include trimethylsilyl, triethylsilyl, t-butyldimethylsilyl, triisopropylsilyl, and t-butyldiphenylsilyl.

Examples of the optionally substituted C1-C30 alkyl group as represented by $R^1$, $R^2$, $R^3$, $R^4$, $R^5$, $R^6$, Y, R, and R' in general formula (I) include straight-chain, branched, or cyclic alkyl groups, such as methyl, ethyl, propyl, isopropyl, butyl, s-butyl, t-butyl, isobutyl, amyl, isoamyl, t-amyl, hexyl, heptyl, isoheptyl, t-heptyl, n-octyl, isooctyl, t-octyl, 2-ethylhexyl, n-nonyl, n-decyl, n-dodecyl, n-tridecyl, n-tetradecyl, n-pentadecyl, n-hexadecyl, n-heptadecyl, n-octadecyl, cyclopropyl, cyclobutyl, cyclopentyl, cyclohexyl, cycloheptyl, cyclooctyl, cyclononyl, and cyclodecyl. Examples of the alkyl group the methylene chain of which is interrupted by —O— include methoxy, ethoxy, propyloxy, isopropyloxy, methoxymethyl, ethoxymethyl, and 2-methoxyethyl. Examples of the alkyl group the methylene chain of which is interrupted by —S— include methylthio, ethylthio, butylthio, and pentylthio. Examples of the alkyl group the methylene chain of which is interrupted by —SO$_2$— include methylsulfonyl, ethylsulfonyl, butylsulfonyl, and pentylsulfonyl. Examples of the alkyl group the methylene chain of which is interrupted by —CO— include acetyl, 1-carbonylethyl, acetylmethyl, 1-carbonylpropyl, 2-oxobutyl, 2-acetylethyl, 1-carbonylisopropyl, and cyclopentanecarbonyl. Examples of the alkyl group the methylene chain of which is interrupted by —OCO— include acetoxy, propionyloxy, and butyryloxy. Examples of the alkyl group the methylene chain of which is interrupted by —COO— include methoxycarbonyl, ethoxycarbonyl, and isopropyloxycarbonyl.

Examples of the optionally substituted C6-C30 aryl group represented by $R^1$, $R^2$, $R^3$, $R^4$, $R^5$, $R^6$, Y, R, and R' in general formula (I) include phenyl, naphthyl, biphenyl, terphenyl, pyrene, fluorene, and 9,9-spirobifluorene. Examples of the aryl group of which the bond to the naphtholactam structure is interrupted by —O— include phenoxy, 1-naphthoxy, and 2-naphthoxy. Examples of the aryl group of which the bond to the naphtholactam structure is interrupted by —S— include phenylthio, 1-naphthylthio, and 2-naphthylthio. Examples of the aryl group of which the bond to the naphtholactam structure is interrupted by —SO$_2$— include phenylsulfone, 1-naphthylsulfone, and 2-naphthylsulfone. Examples of the aryl group of which the bond to the naphtholactam structure is interrupted by —CO— include benzoyl, 1-naphthoyl, and 2-naphthoyl. Examples of the aryl group of which the bond to the naphtholactam structure is interrupted by —OCO— include benzoyloxy, 1-naphthoyloxy, and 2-naphthoyloxy. Examples of the aryl group of which the bond to the naphtholactam structure is interrupted by —COO— include phenoxycarbonyl and 1-naphthoxycarbonyl.

Examples of the optionally substituted C7-C30 arylalkyl group represented by $R^1$, $R^2$, $R^3$, $R^4$, $R^5$, $R^6$, and Y in general formula (I) include benzyl, phenethyl, 2-phenylpropyl, diphenylmethyl, triphenylmethyl, and 4-chlorophenylmethyl. Examples of the arylalkyl group the methylene chain of which is interrupted by —O— include benzyloxy, phenoxymethyl, phenoxyethyl, 1-naphthylmethoxy, 2-naphthylmethoxy, and 1-anthrylmethoxy. Examples of the arylalkyl group the methylene chain of which is interrupted by —S— include benzylthio, phenylthiomethyl, and phenylthioethyl. Examples of the arylalkyl group the methylene chain of which is interrupted by —SO$_2$— is exemplified by benzylsulfonyl. Examples of the arylalkyl group the methylene chain of which is interrupted by —CO— include benzylcarbonyl, phenethylcarbonyl, and 1-naphthylmethylcarbonyl. Examples of the arylalkyl group the methylene chain of which is interrupted by —OCO— include a phenylacetate group and a 1-naphthylacetate group. Examples of the arylalkyl group the methylene chain of which is interrupted by —COO— include benzyloxycarbonyl and phenethyloxycarbonyl.

Examples of the substituents of the optionally substituted C1-C30 alkyl group, the optionally substituted C6-C30 aryl group, and the optionally substituted C7-C30 arylalkyl group include alkyl groups, such as methyl, ethyl, propyl, isopropyl, cyclopropyl, butyl, sec-butyl, tert-butyl, isobutyl, amyl, isoamyl, tert-amyl, cyclopentyl, hexyl, 2-hexyl, 3-hexyl, cyclohexyl, bicyclohexyl, 1-methylcyclohexyl, heptyl, 2-heptyl, 3-heptyl, isoheptyl, tert-heptyl, n-octyl, isooctyl, tert-octyl, 2-ethylhexyl, nonyl, isononyl, and decyl; alkoxy groups, such as methyloxy, ethyloxy, propyloxy, isopropyloxy, butyloxy, sec-butyloxy, tert-butyloxy, isobutyloxy, amyloxy, isoamyloxy, tert-amyloxy, hexyloxy, cyclohexyloxy, heptyloxy, isoheptyloxy, tert-heptyloxy, n-octyloxy, isooctyloxy, tert-octyloxy, 2-ethylhexyloxy, nonyloxy, and decyloxy; alkylthio groups, such as methylthio, ethylthio, propylthio, isopropylthio, butylthio, sec-butylthio, tert-butylthio, isobutylthio, amylthio, isoamylthio, tert-amylthio, hexylthio, cyclohexylthio, heptylthio, isoheptylthio, tert-heptylthio, n-octylthio, isooctylthio, tert-octylthio, and 2-ethylhexylthio; alkenyl groups, such as vinyl, 1-methylethenyl, 2-methylethenyl, 2-propenyl, 1-methyl-3-propenyl, 3-butenyl, 1-methyl-3-butenyl, isobutenyl, 3-pentenyl, 4-hexenyl, cyclohexenyl, bicyclohexenyl, heptenyl, octenyl, decenyl, pentadecenyl, eicosenyl, and tricosenyl; arylalkyl groups, such as benzyl, phenethyl, diphenylmethyl, triphenylmethyl, styryl, and cinnamyl; aryl groups, such as phenyl and naphthyl; aryloxy groups, such as phenoxy and naphthyloxy; arylthio groups, such as phenylthio and naphthylthio; halogen atoms, such as fluorine, chlorine, bromine, and iodine; acyl groups, such as acetyl, 2-chloroacetyl, propionyl, octanoyl, acryloyl, methacryloyl, phenylcarbonyl (i.e., benzoyl), phthaloyl, 4-trifluoromethylbenzoyl, pivaloyl, salicyloyl, oxaloyl, stearoyl, methoxycarbonyl, ethoxycarbonyl, t-butoxycarbonyl, n-octadecyloxycarbonyl, and carbamoyl; acyloxy groups, such as acetyloxy and benzoyloxy; an amino group; substituted amino groups, such as ethylamino, dimethylamino, diethylamino, butylamino, cyclopentylamino, 2-ethylhexylamino, dodecylamino, anilino, chlorophenylamino, toluidino, anisidino, N-methylanilino, diphenylamino, naphthylamino, 2-pyridylamino, methoxycarbonylamino, phenoxycarbonylamino, acetylamino, benzoylamino, formylamino, pivaloylamino, lauroylamino, carbamoylamino, N,N-dimethylaminocarbonylamino, N,N-diethylaminocarbonylamino, morpholinocarbonyl-amino, methoxycarbonylamino, ethoxycarbonylamino, t-butoxycarbonylamino, n-octadecyloxycarbonylamino, N-methylmethoxycarbonylamino, phenoxycarbonyl-amino, sulfamoylamino, N,N-dimethylaminosulfonylamino, methylsulfonylamino, butylsulfonylamino, and phenylsulfonylamino; alkylsilyl groups, such as trimethylsilyl, triethylsilyl, t-butyldimethylsilyl, triisopropylsilyl, and t-butyldiphenylsilyl; sulfonamido, sulfonyl, carboxyl, cyano, sulfo, hydroxyl, nitro, mercapto, imido, carbamoyl, and sulfonamido. These substituents may be substituted. The carboxyl group, and the sulfo group may be in the form of a salt. When the substituent of the alkyl, aryl, or arylalkyl as $R^1$, $R^2$, $R^3$, $R^4$, $R^5$, $R^6$, Y, R or R' contains a carbon atom, the total number of carbon atoms inclusive of that of the substituent shall fall within the respective ranges recited.

The optical filter of the invention containing the naphtholactam derivative represented by general formula (I) is suited for use as an optical filter that absorbs light of wavelengths of from 300 nm to 700 nm In the case when the naphtholactam derivative of formula (I) has wavelength converting capability, the optical filter of the invention can be used as a color conversion filter having wavelength conversion performance. Whether the naphtholactam derivative of formula (I) exhibits wavelength conversion performance depends on the chemical structure.

For the use of the optical filter of the invention as a color conversion filter having wavelength conversion performance, it is preferred that in general formula (I) $R^1$, $R^2$, $R^3$, $R^4$, $R^5$, and $R^6$ be each independently hydrogen, halogen, —NRR' (wherein R and R' is optionally substituted C6-C30, preferably C6-C25, aryl), optionally substituted C1-C30, preferably C1-C5, alkyl the methylene chain of which may be interrupted by —O—, —S—, —SO$_2$—, —CO—, —OCO—, or —COO—, optionally substituted C6-C30, preferably C6-C25, aryl, or optionally substituted C7-C30, preferably C7-C20, arylalkyl the methylene chain of which may be interrupted by —O—, —S—, —SO$_2$—, —CO—, —OCO—, or —COO—. It is particularly preferred that $R^4$ be optionally substituted C6-C30, especially C6-C25, aryl.

To provide a color conversion filter with high wavelength-conversion performance, it is more preferred that each of $R^1$, $R^2$, $R^3$, and $R^5$ be hydrogen; $R^4$ be any one of the atoms or groups described above as preferred; and $R^6$ be hydrogen or halogen. It is particularly preferred that each of $R^1$, $R^2$, $R^3$, $R^4$, $R^5$, and $R^6$ be hydrogen or that each of $R^1$, $R^2$, $R^3$, and $R^5$ be hydrogen; $R^4$ be halogen; and $R^6$ be hydrogen or halogen.

For the use of the optical filter of the invention as a color conversion filter having wavelength conversion performance, Y in general formula (I) is preferably hydrogen, optionally substituted C1-C30, preferably C1-C5, alkyl, optionally substituted C6-C30, preferably C6-C25, aryl, or optionally substituted C7-C30, preferably C7-C15, arylalkyl; more preferably halogen-substituted C1-C20, preferably C1-C5, alkyl, halogen-substituted C6-C20, preferably C6-C10, aryl, or halogen-substituted C7-C20, preferably C7-C15, arylalkyl; even more preferably halogen-substituted C7-C20, preferably C7-C15, arylalkyl.

For the use of the optical filter of the invention as a color conversion filter having wavelength conversion performance, X in general formula (I) is preferably oxygen.

The preferred ranges of $R^1$, $R^2$, $R^3$, $R^4$, $R^5$, $R^6$, X, and Y recited above in terms of wavelength conversion performance are preferred in terms of light resistance as well.

The naphtholactam derivatives of general formula (I) which have no or low wavelength conversion performance but are preferred as having high light resistance include those in which each of $R^1$, $R^2$, $R^3$, $R^5$ and $R^6$ are hydrogen, and $R^4$ is —NRR' (wherein R and R' are each optionally substituted C1-C30, preferably C1-C10, alkyl).

From the viewpoint of light resistance, Y is particularly preferably hydrogen or optionally substituted C1-C30 alkyl.

Specific examples of the naphtholactam derivative of general formula (I) include, but are not limited to, compound Nos. 1 through 178 shown below.

[Chemical Formula 2]

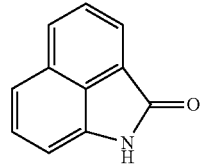

Compound No.1

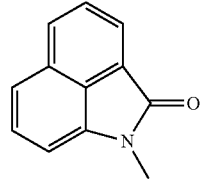

Compound No.2

Compound No.3
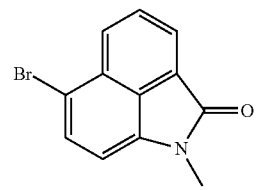
Compound No.4
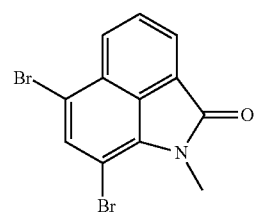
Compound No.5
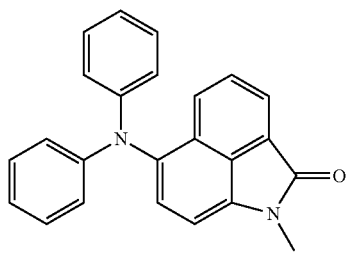
Compound No.6
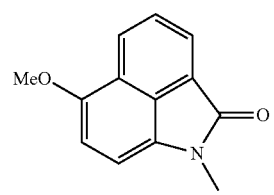
Compound No.7
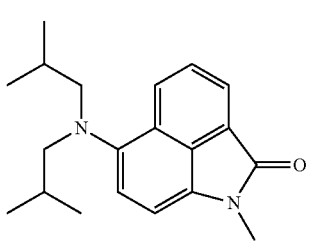
Compound No.8
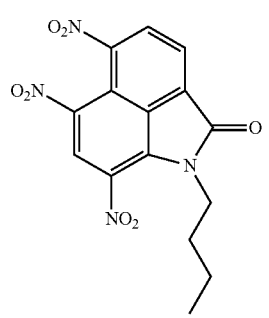
Compound No.9
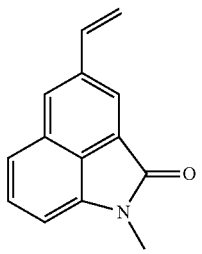
Compound No.10
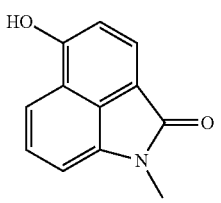
Compound No.11
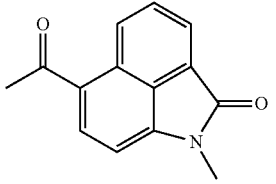
Compound No.12
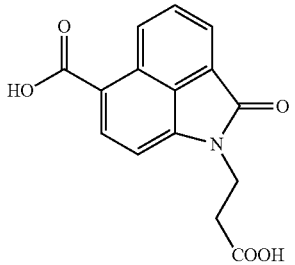
Compound No.13
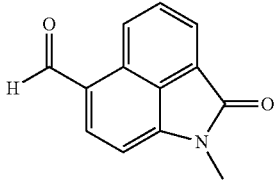
Compound No.14
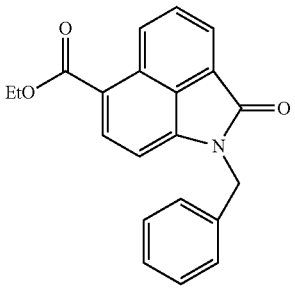
Compound No.15
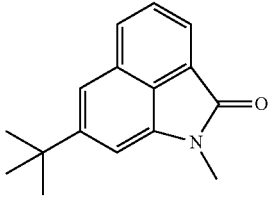

Compound No.16
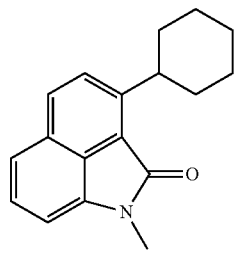
[Chemical Formula 3]
Compound No.17
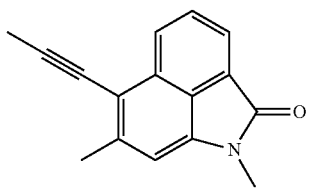
Compound No.18
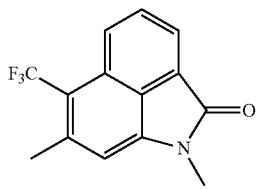
Compound No.19
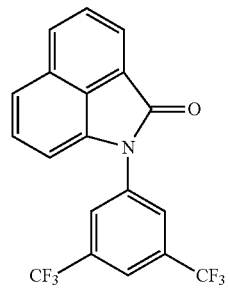
Compound No.20
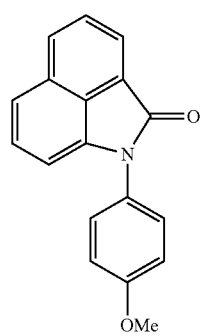
Compound No.21
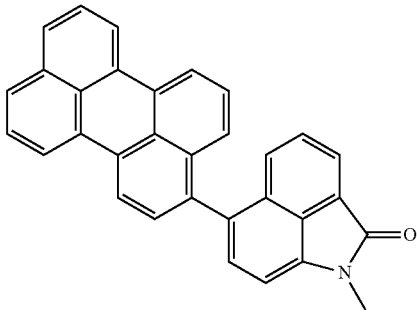
Compound No.22
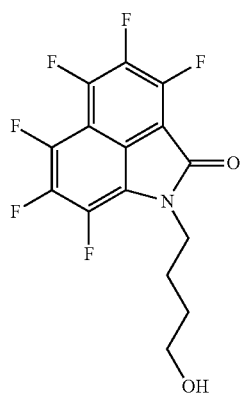
Compound No.23
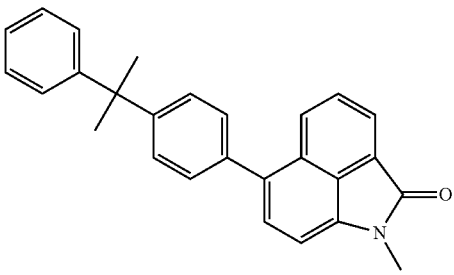
Compound No.24
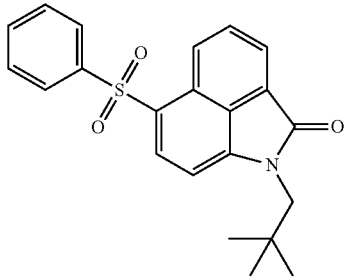
Compound No.25
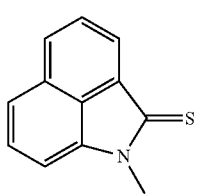

Compound No.26
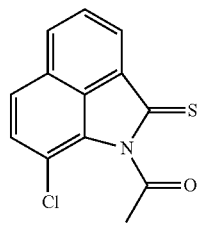
Compound No.27
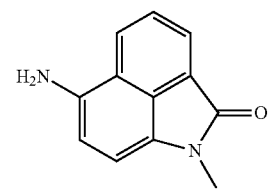
Compound No.29
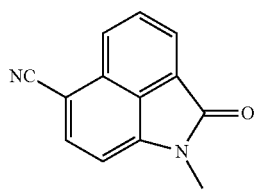
[Chemical Formula 4-1]
Compound No.30
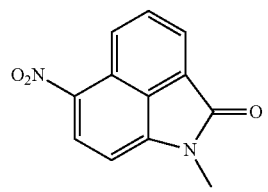
Compound No.31
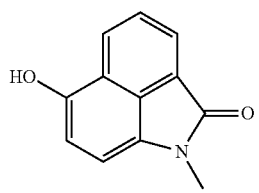
Compound No.32
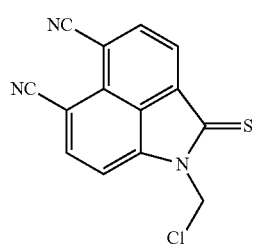
Compound No.33
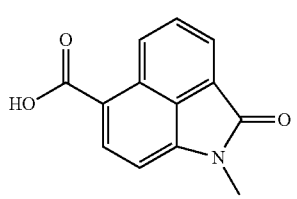
Compound No.34
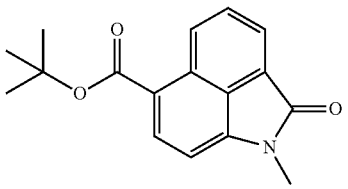
Compound No.35
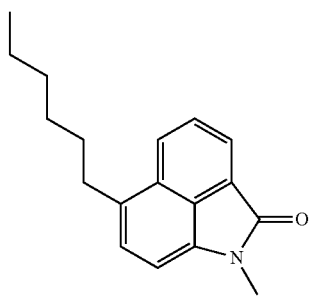
Compound No.36
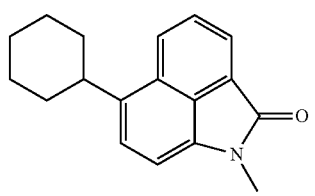
Compound No.37
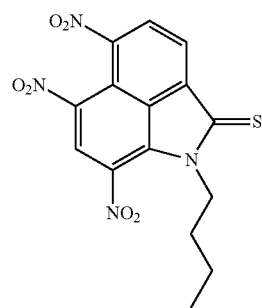
Compound No.38
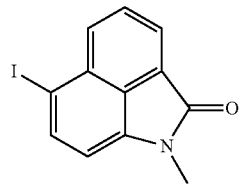
Compound No.39
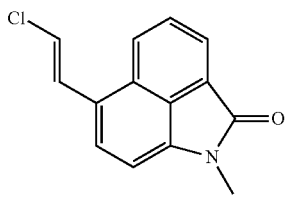

-continued
Compound No.40
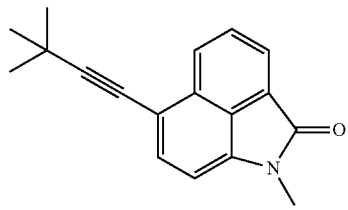
Compound No.41
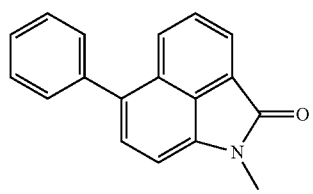
Compound No.42
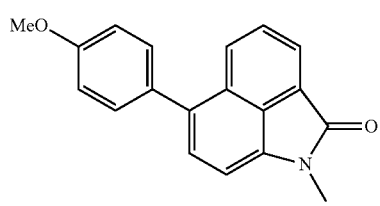
Compound No.43
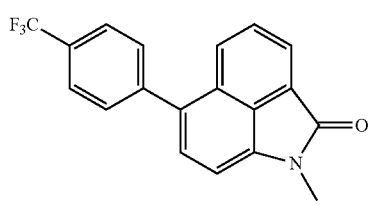
Compound No.44
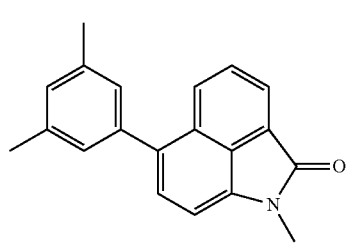
Compound No.45
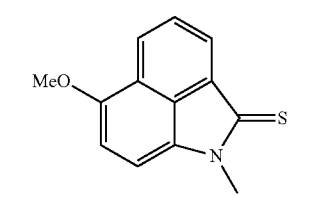
Compound No.46
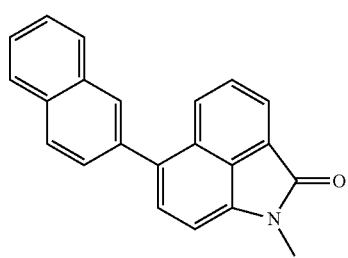
-continued
[Chemical Formula 4-2]
Compound No.47
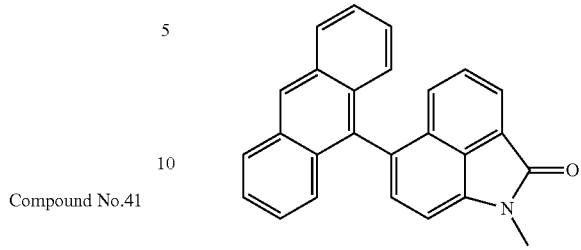
Compound No.48
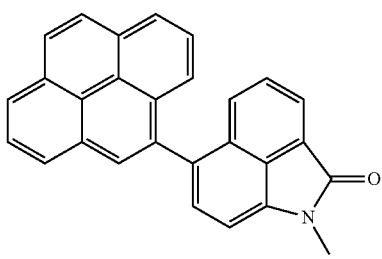
Compound No.49
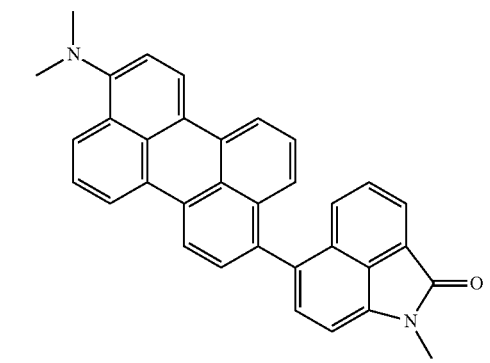
Compound No.50
Compound No.51
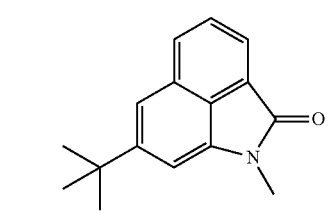
Compound No.52
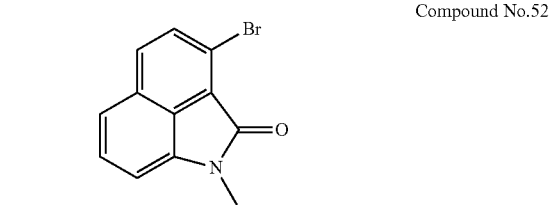

Compound No.53
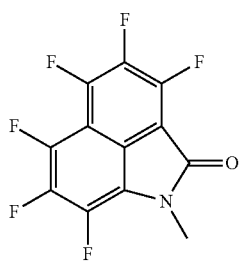
Compound No.54
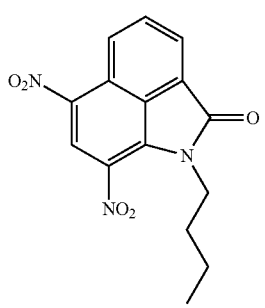
Compound No.55
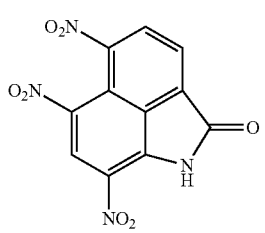
Compound No.56
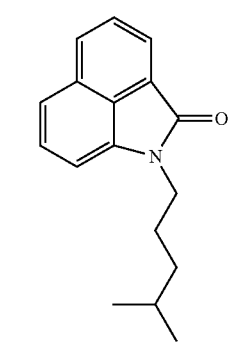
Compound No.57
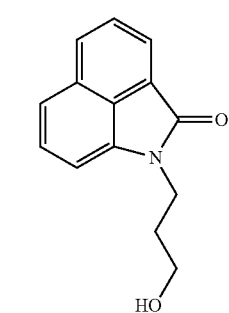
Compound No.58
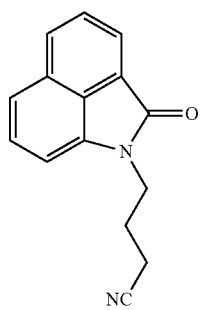
Compound No.59
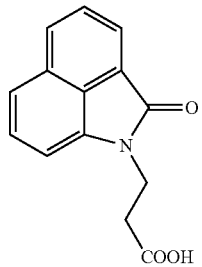
Compound No.60
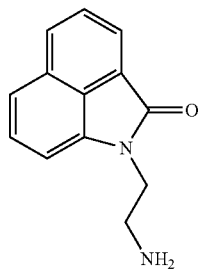
Compound No.61
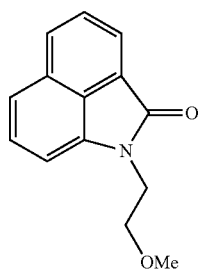
[Chemical Formula 4-3]
Compound No.62
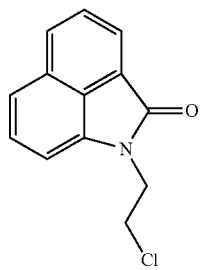

-continued
Compound No. 63
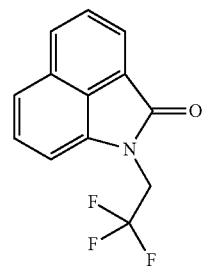
Compound No. 64
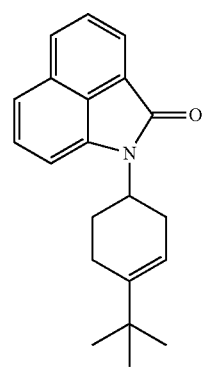
Compound No. 65
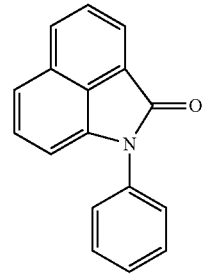
Compound No. 66
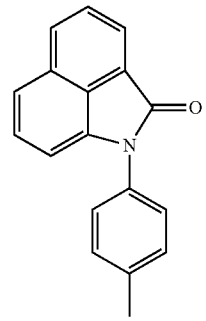
Compound No. 67
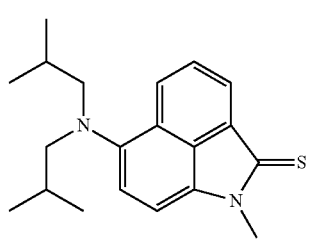
-continued
Compound No. 68
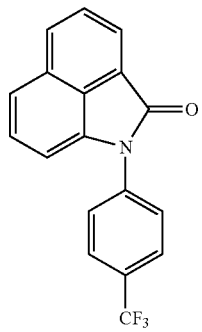
Compound No. 69
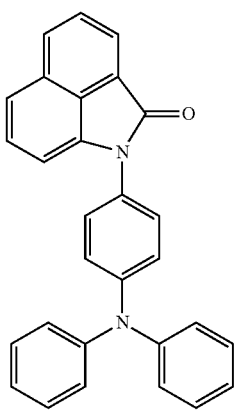
Compound No. 70
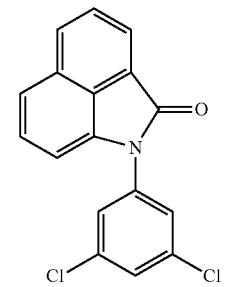
Compound No. 71
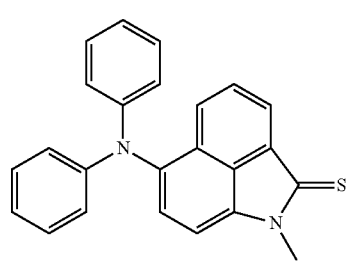
Compound No. 72
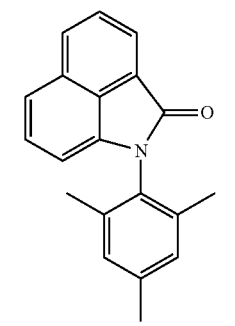

[Chemical Formula 4-4]
Compound No.73
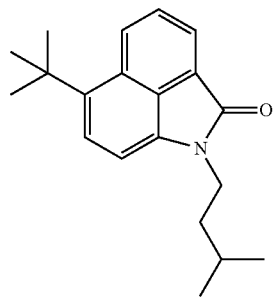
Compound No.74
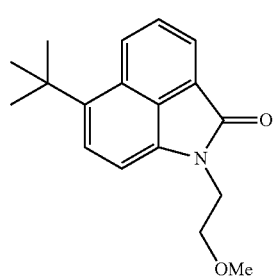
Compound No.75
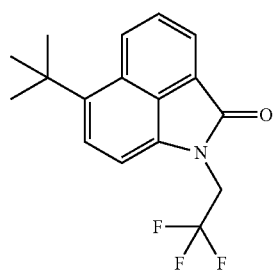
Compound No.76
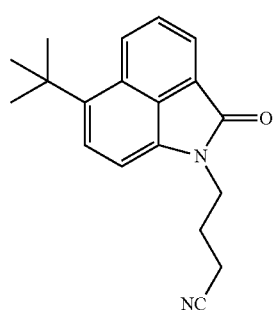
Compound No.77
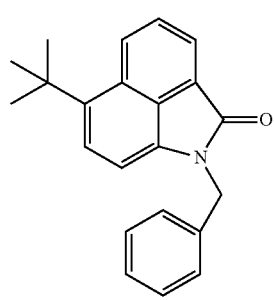
Compound No.78
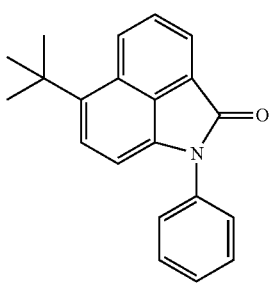
Compound No.79
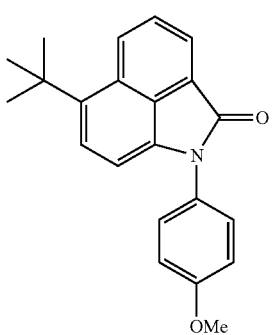
Compound No.80
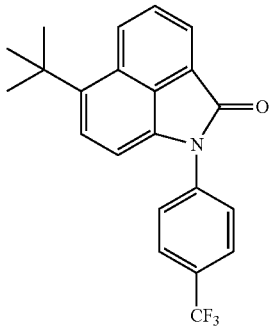
Compound No.81
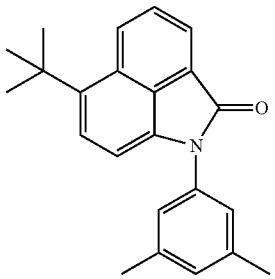
Compound No.82
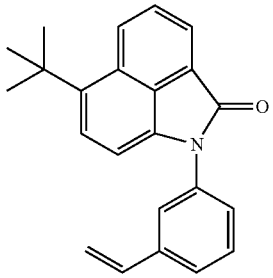

Compound No.83
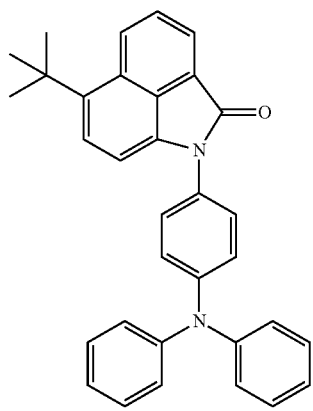
Compound No.84
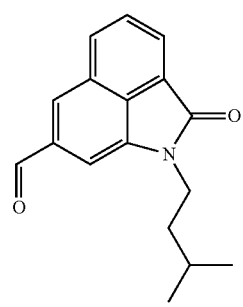
Compound No.85
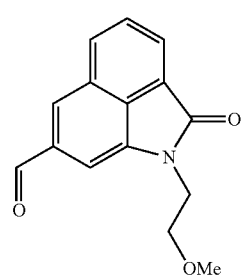
Compound No.86
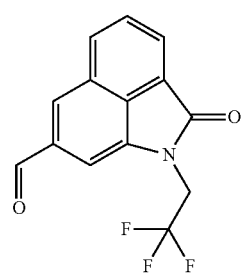
Compound No.87
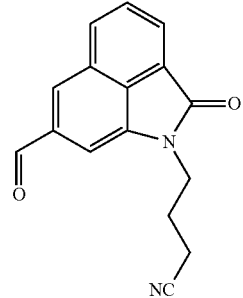
Compound No.88
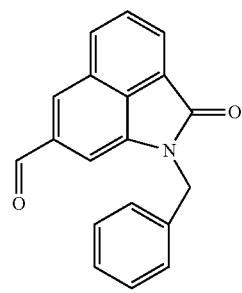
Compound No.89
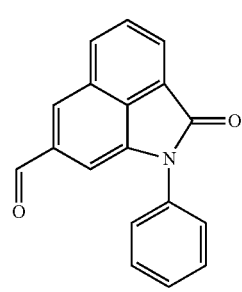
Compound No.90
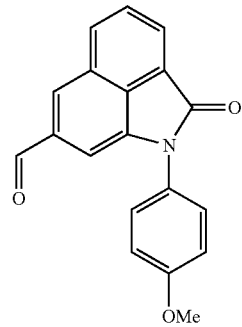
Compound No.91
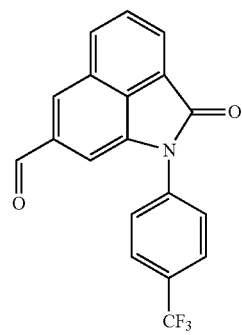
Compound No.92
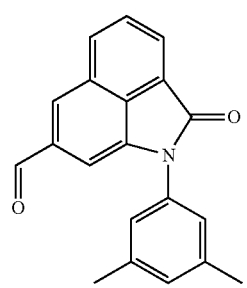

Compound No.93
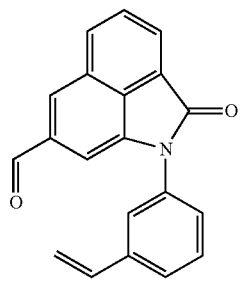
[Chemical Formula 4-5]
Compound No.94
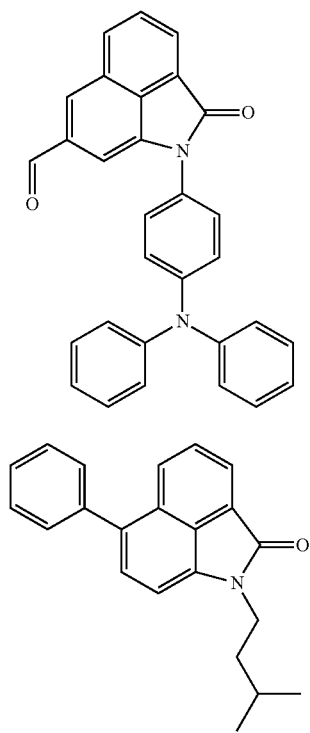
Compound No.95
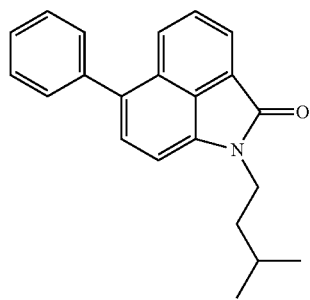
Compound No.96
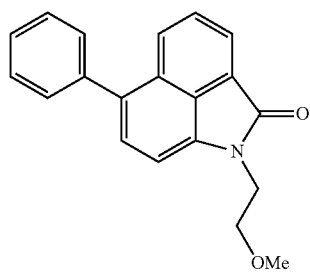
Compound No.97
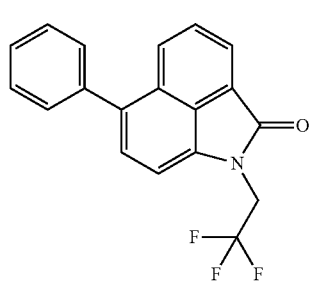
Compound No.98
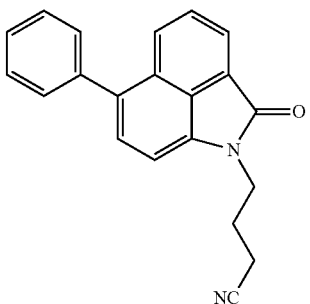
Compound No.99
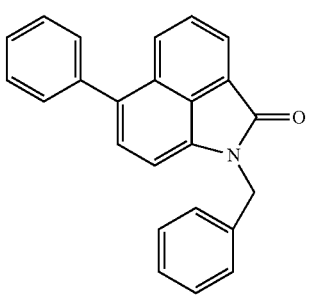
Compound No.100
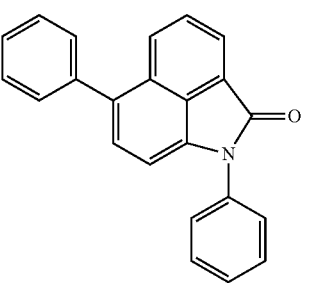
Compound No.101
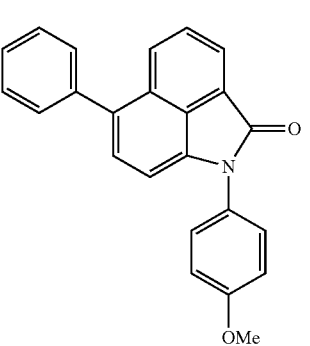
Compound No.102
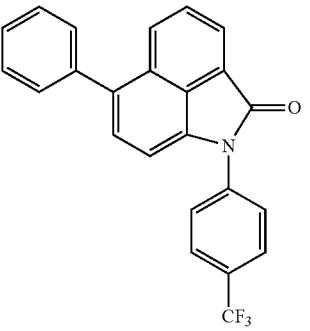

-continued
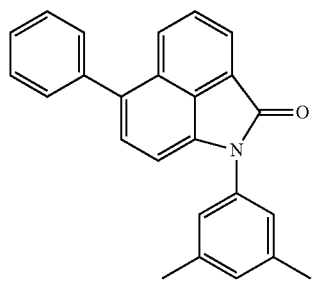
Compound No.103
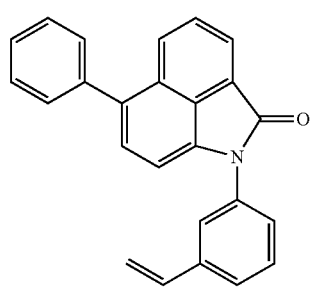
Compound No.104
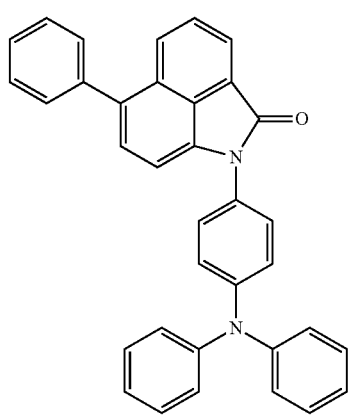
Compound No.105
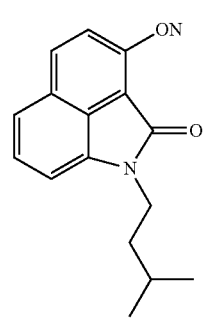
Compound No.106
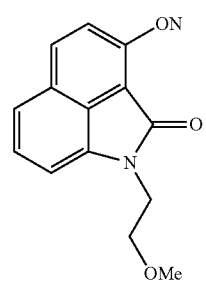
Compound No.107
-continued
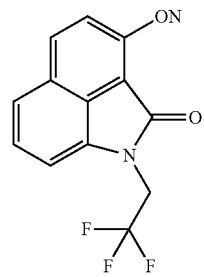
Compound No.108
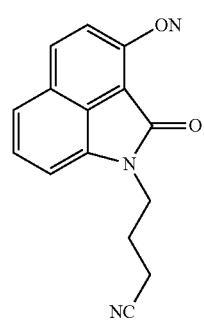
Compound No.109
[Chemical Formula 4-6]
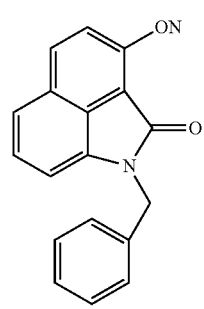
Compound No.110
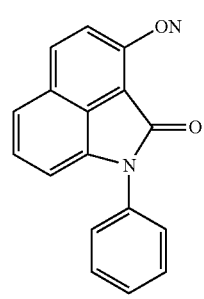
Compound No.111
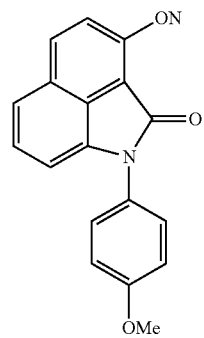
Compound No.112

Compound No.113

Compound No.114

Compound No.115

Compound No.116

Compound No.117

Compound No.118

Compound No.119

Compound No.120

Compound No.121

Compound No.122
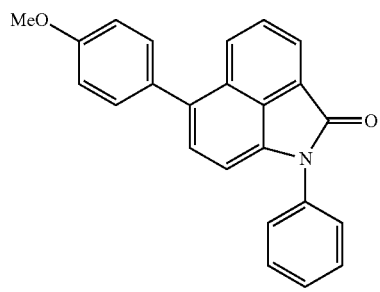
Compound No.123
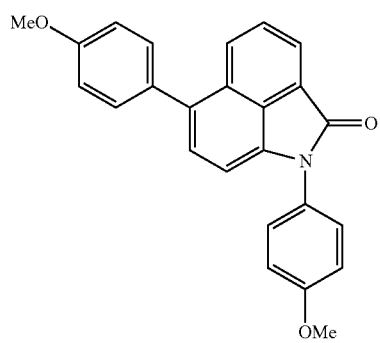
[Chemical Formula 4-7]
Compound No.124
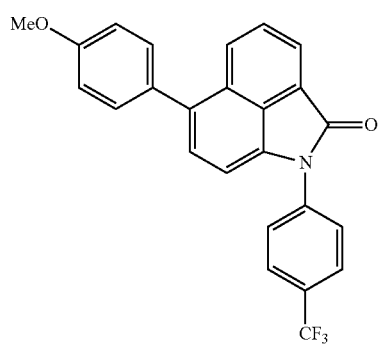
Compound No.125
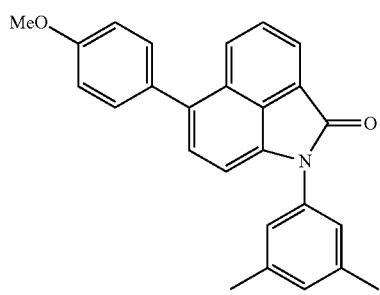
Compound No.126
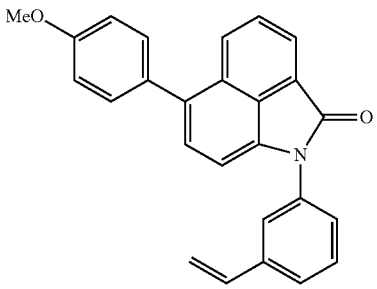
Compound No.127
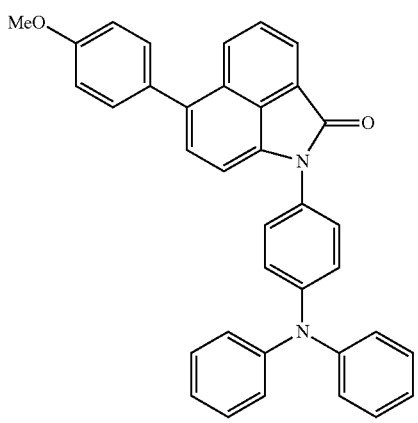
Compound No.128
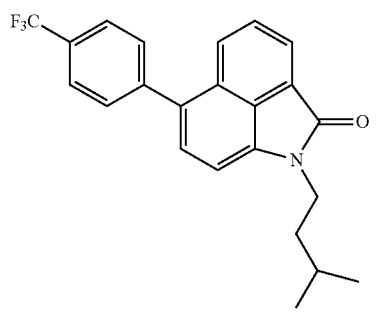
Compound No.129
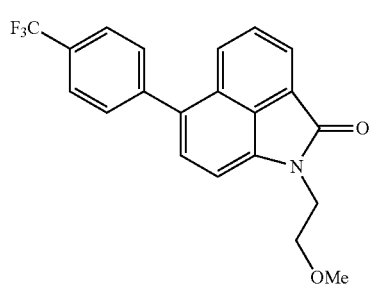

Compound No.130
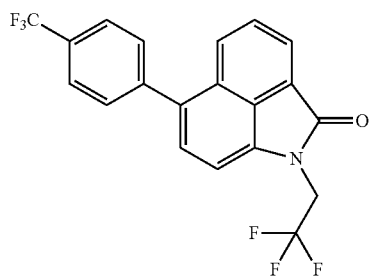
Compound No.131
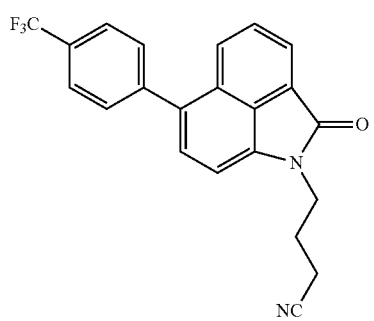
Compound No.132
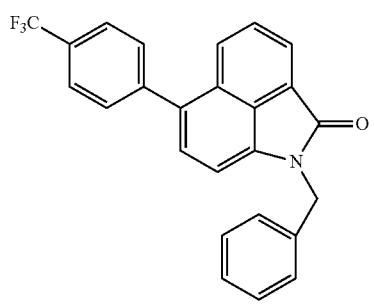
Compound No.133
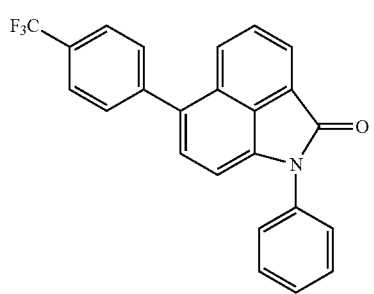
Compound No.134
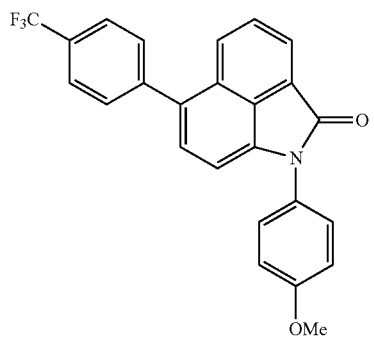
Compound No.135
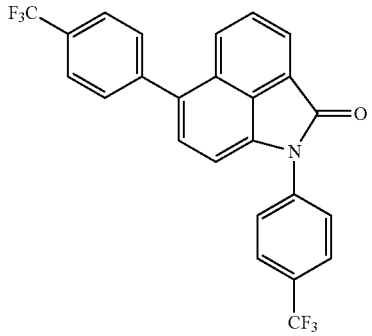
[Chemical Formula 4-8]
Compound No.136
Compound No.137
Compound No.138

Compound No.139
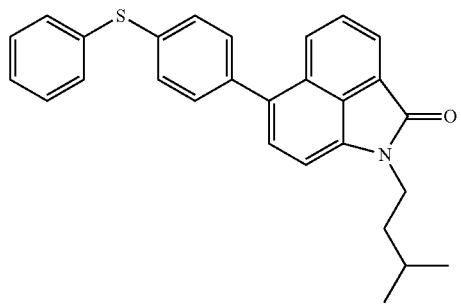
Compound No.140
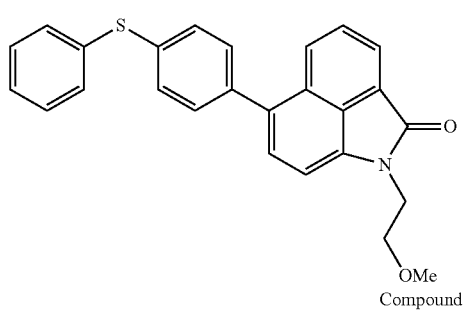
Compound No.141
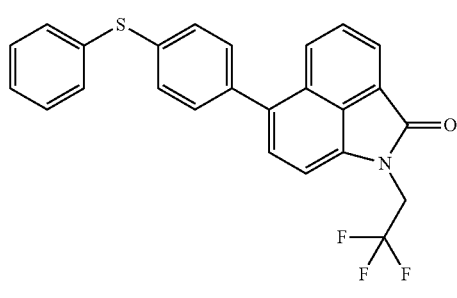
Compound No.142
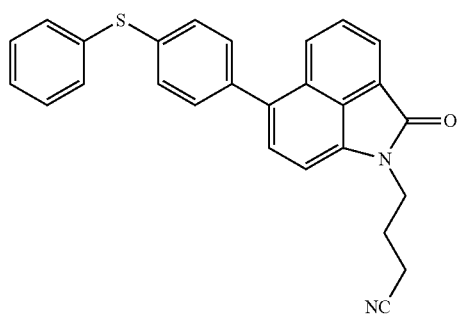
Compound No.143
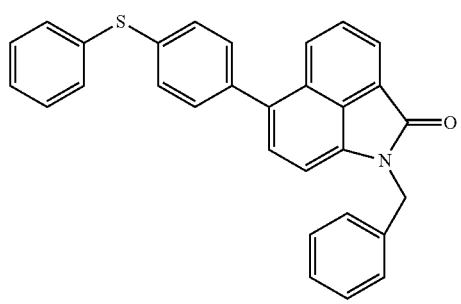
Compound No.144
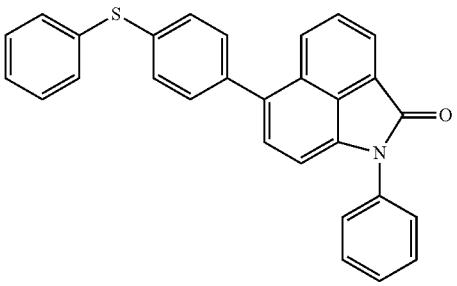
Compound No.145
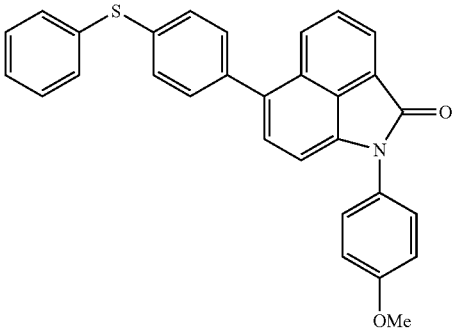
Compound No.146
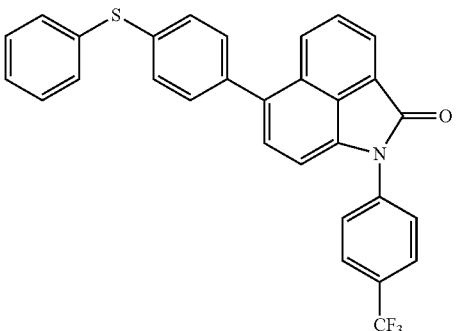
Compound No.147
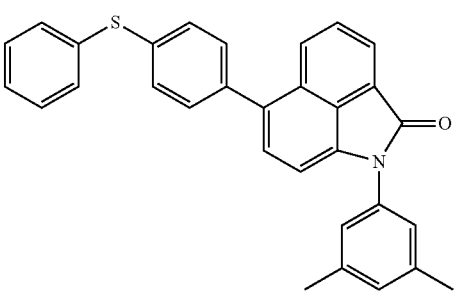

[Chemical Formula 4-9]
Compound No.148
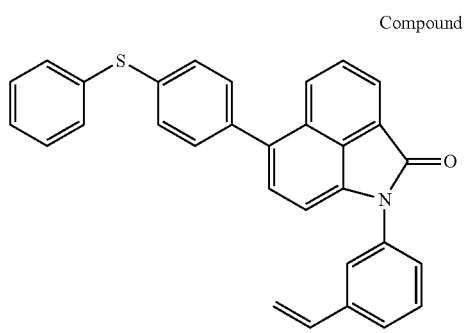
Compound No.149
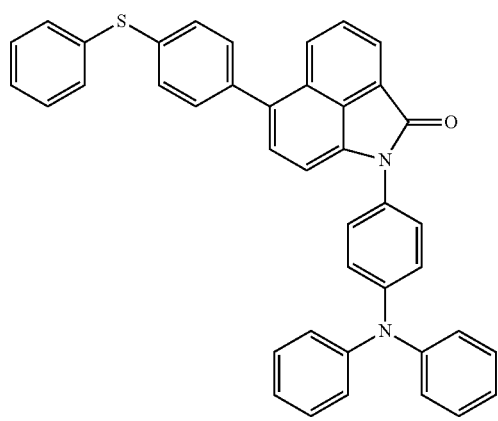
Compound No.150
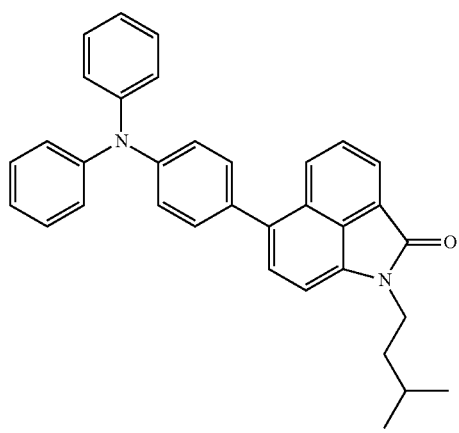
Compound No.151
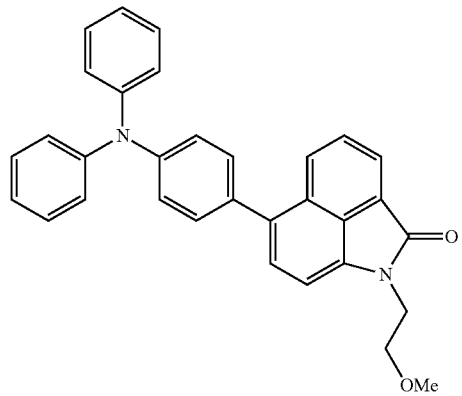
Compound No.152
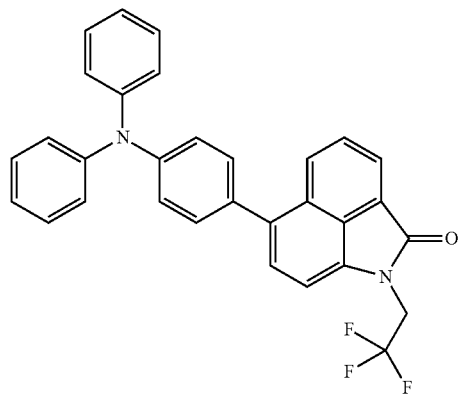
Compound No.153
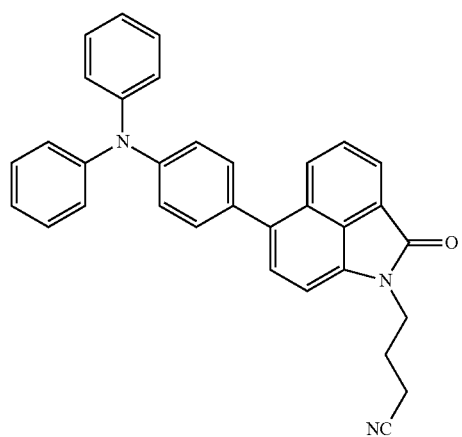

[Chemical Formula 4-10]
Compound No.154
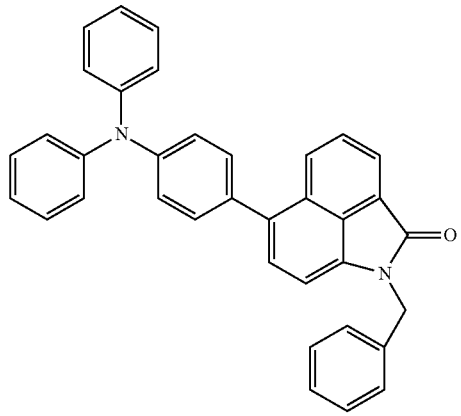
Compound No.155
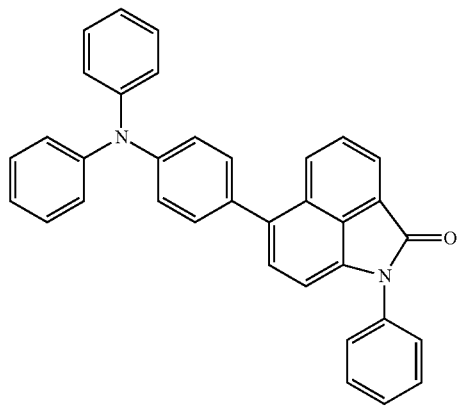
Compound No.156
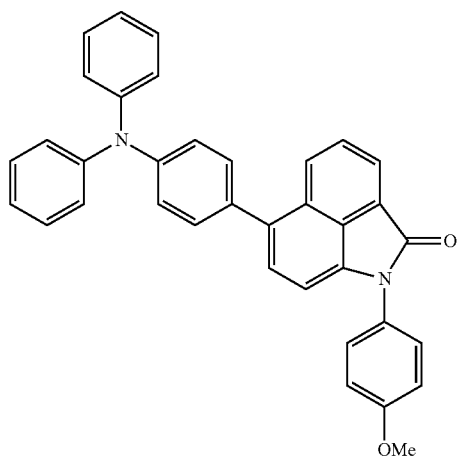
Compoound No.157
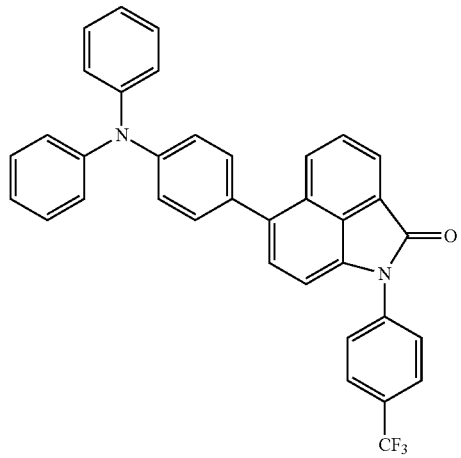
Compound No.158
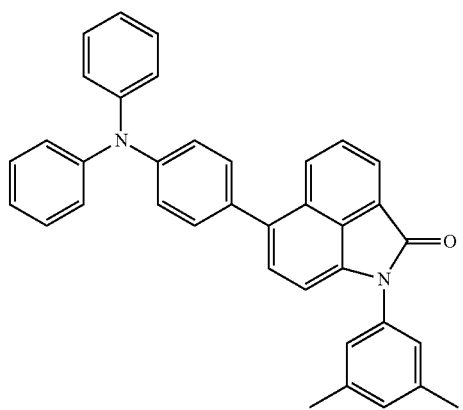
Compound No.159
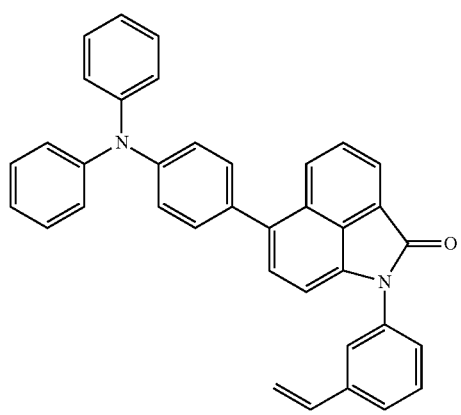

[Chemical Formula 4-11]
Compound No.160
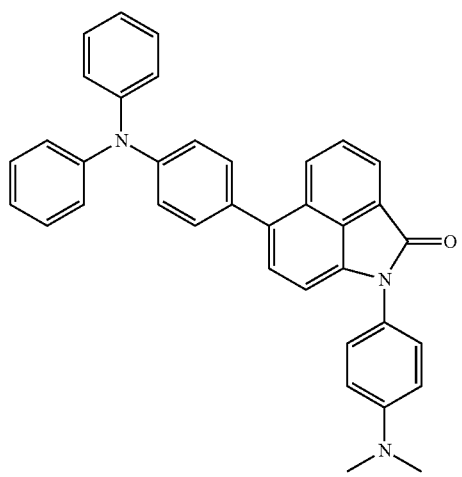
Compound No.161
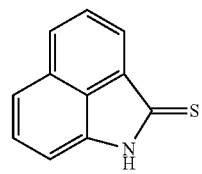
Compound No.162
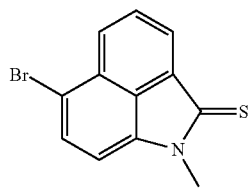
Compound No.163
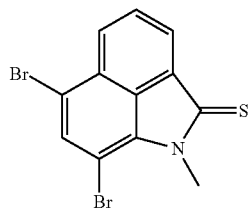
Compound No.164
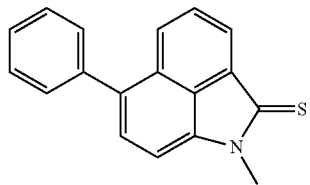
Compound No.165
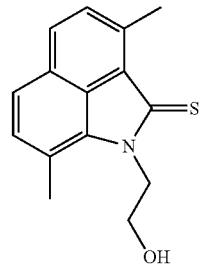
Compound No.166
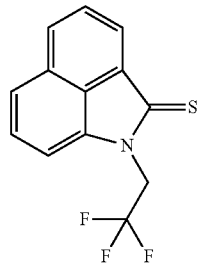
Compound No.167
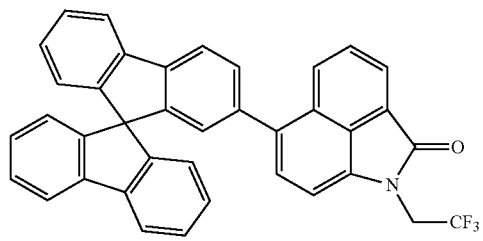
Compound No.168
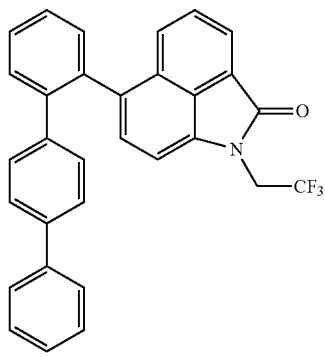
Compound No.169
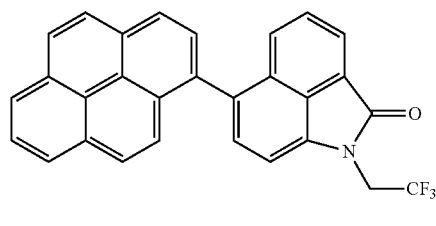
Compound No.170
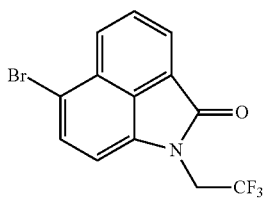

Compound No.171
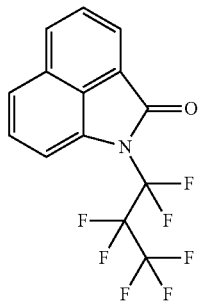

Compound No.172
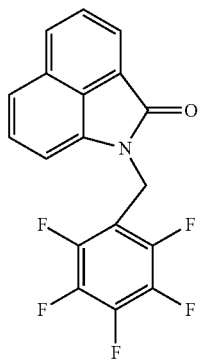

[Chemical Formula 4-12]

Compound No.173
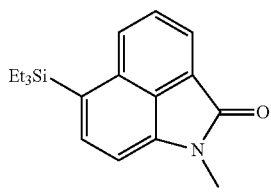

Compound No.174
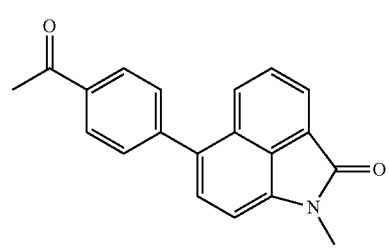

Compound No.175
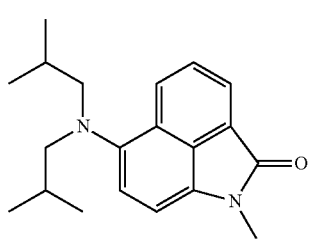

Compound No.176
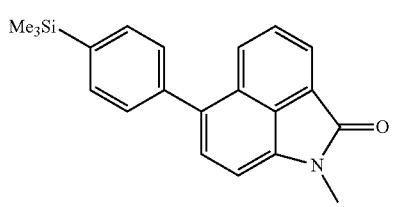

Compound No.177
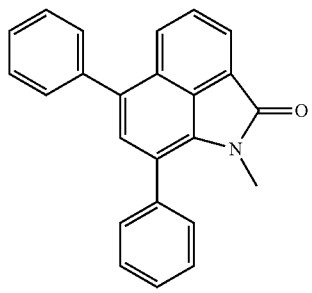

Compound No.178
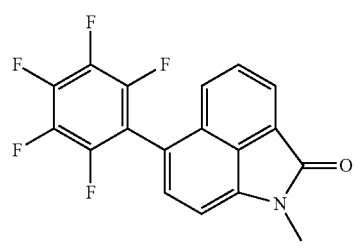

The process for preparing the naphtholactam derivative of general formula (I) is not particularly limited. For example, the naphtholactam derivative is prepared as follows in accordance with the reaction scheme shown below. 1,8-Naphthalic anhydride is allowed to react with hydroxylamine hydrochloride in pyridine, and the product is allowed to react with p-toluenesulfonyl chloride (TsCl) to obtain an intermediate tosyl compound. Sodium hydroxide is then caused to react with the tosyl compound, followed by detosylation with concentrated hydrochloric acid to give naphtholactam (compound No. 1). Introducing substituents ($R^1$, $R^2$, $R^3$, $R^4$, $R^5$, $R^6$, and Y) to the resulting naphtholactam in a usual manner yields naphtholactam derivatives represented by general formula (I) in which $R^1$, $R^2$, $R^3$, $R^4$, $R^5$, $R^6$ and Y are substituents.

[Chemical Formula 5]

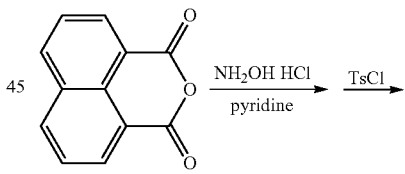

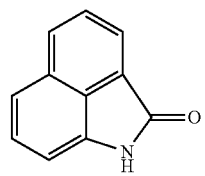

The optical filter of the invention containing the naphtholactam derivative is suited for use as an optical filter that absorbs light of 300 to 700 nm, especially 300 to 500 nm.

Some of the naphtholactam derivatives have wavelength conversion performance and some do not, depending on the chemical structure. The optical filter in which the naphtholactam derivative has wavelength conversion performance is usable as a color conversion filter having wavelength conversion performance. The optical filter of the invention which is a color conversion filter having wavelength conversion performance (hereinafter also referred to as the color conversion filter of the invention) is usable as a color conversion filter that absorbs light, e.g., of 300 to 500 nm and emits light, e.g., of 400 to 700 nm.

The optical filter of the invention in which the naphtholactam derivative does not have wavelength conversion performance is usable as a light absorbing filter that absorbs light, e.g., of 300 to 700 nm.

The optical filter of the invention having wavelength conversion performance is useful as a color conversion filter for use in, for example, image displays, such as LCDs, PDPs, EL devices, CRTs, vacuum fluorescent displays, and field emission displays; light-converting light-emitting devices, such as LED lamps and EL lamps; and photoelectric devices, such as solar cells.

The optical filter of the invention having no wavelength conversion performance is useful for, for example, tone correction in the above described image displays.

The optical filter of the invention is not structurally limited and structurally identical to conventional optical filters with the exception that it contains the naphtholactam derivative of general formula (I). Similar to conventional optical filters, the optical filter of the invention has at least a substrate and, if desired, any functional layer, such as an optically functional layer, a primer layer, an antireflective layer, a hardcoat layer, and a lubricant layer. The naphtholactam derivative may be present in either the substrate or any functional layer. It is usually preferred for the naphtholactam derivative to be present in the substrate or the optically functional layer.

Figure 1B:
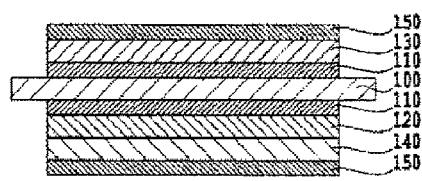
FIG. 1(b) is a cross-section of another preferred embodiment of the optical filter according to the invention.
Figure 1C:
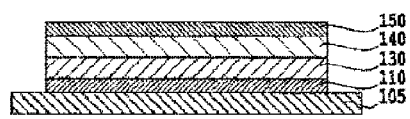
FIG. 1(c) is a cross-section of still another preferred embodiment of the optical filter according to the invention.

Configurations of preferred embodiments of the optical filter of the invention are illustrated in FIGS. 1(a), 1(b), and 1(c). The light absorbing filter may include a substrate 100 and an optically functional layer 120 containing the naphtholactam derivative of general formula (I) and may optionally include, when needed, a primer layer 110, an antireflective layer 130, a hardcoat layer 140, a lubricating layer 150, and so on. As illustrated in FIG. 1(a), a primer layer 110, an optically functional layer 120, an antireflective layer 130, a hardcoat layer 140, and a lubricating layer 150 may be stacked in that order on one side of a substrate 100. As illustrated in FIG. 1(b), a primer layer 110, an optically functional layer 120, a hardcoat layer 140 and a lubricating layer 150 may be stacked in that order on one side of a substrate 100, and a primer layer 110, an antireflective layer 130, and a lubricating layer 150 may be stacked in that order on the other side of the substrate 100. As illustrated in FIG. 1(c), the optical filter may have a structure including an optically functional substrate 105 containing the naphtholactam derivative of the invention, on which a primer layer 110, an antireflective layer 130, a hardcoat layer 140, and a lubricating layer 150 are stacked in that order.

The optically functional layer or the optically functional substrate each containing the naphtholactam derivative of general formula (I) functions as a light absorbing layer when the naphtholactam derivative does not have wavelength conversion capability, or functions as a color conversion layer doubling as a light absorbing layer when the naphtholactam derivative has wavelength conversion performance.

The substrate 100 may be of an inorganic material such as glass or a polymer, such as polyethylene terephthalate, polymethyl methacrylate, polyvinyl butyral, polyvinylpyrrolidone, polyvinyl alcohol, polyvinyl chloride, styrene-butadiene copolymers, polystyrene, polycarbonate, polyamide, ethylene-vinyl acetate copolymer resins, epoxy resins, polyfluorene resins, and silicone resins. The substrate 100 preferably has a visible light transmittance of at least 80%, more preferably 86% or more; a haze of 2% or less, more preferably 1% or less; and a refractive index of 1.45 to 1.70. The thickness of the substrate 100 is decided as appropriate to the intended use and the like and is generally preferably, but not limited to, from 10 to 10000 µm.

Each of the layers shown in FIG. 1 may contain an IR absorber, a UV absorber, inorganic particles, and the like. The substrate 100 may be subjected to a surface treatment, such as chemical treatment, mechanical treatment, corona discharge treatment, flame treatment, UV irradiation, high frequency treatment, glow discharge treatment, active plasma treatment, laser treatment, mixed acid treatment, and ozone oxidation.

Containing the naphtholactam derivative of general formula (I), the optically functional layer 120 or the optically functional substrate 105 can be designed to function as a light absorbing layer that absorbs light in the wavelength range of from 300 nm to 700 nm. In this case, when the optical filter is intended to be used merely for the purpose of absorbing light in the range described but not intended to be used as a color conversion filter, it is desirable to incorporate a quencher into the optically functional layer 120 or the optically functional substrate 105 in order to quench the fluorescence generated by the optical fiber of the invention on absorbing light of the wavelength range recited. The light absorbing layer may be designed to have a desired hue by adding, to the optically functional layer 120 or the optically functional substrate 105, a colorant absorbing light of other wavelengths.

Examples of the quencher include, but are not limited to, aminium colorants, iminium colorants, cyanine colorants, and transition metal chelate compounds.

Examples of the colorants absorbing light of other wavelengths are not particularly limited and include, for example, cyanine colorants, pyridine colorants, oxazine colorants, coumarin colorants, coumarin dyes, naphthalimide colorants, pyromethene colorants, perylene colorants, pyrene colorants, anthracene colorants, styryl colorants, rhodamine colorants, azo colorants, quinone colorants, squarylium colorants, diketopyrrolopyrrole colorants, iridium complex colorants, europium complex colorants, phthalocyanine colorants, and porphyrin colorants.

If desired, the optically functional layer 120 or the optically functional substrate 105 may further contain a binder (e.g., a photocuring resin, a thermosetting resin, or a thermoplastic resin), a photo stabilizer, a curing agent, an IR absorber, a UV absorber, an antioxidant, a surfactant, an antistatic agent, a flame retarder, a lubricant, a heavy metal deactivator, hydrotalcite, an organic carboxylic acid, a coloring agent, a processing aid, inorganic additives, a filler, a clarifier, a nucleating agent, a crystallizing agent, and so forth.

The form of the optically functional layer 120 or the optically functional substrate 105 is not particularly limited, as long as it contains at least one naphtholactam derivative of general formula (I). For example, it may be film formed from a resin composition in which the naphtholactam derivative is dissolved or dispersed in a binder resin or a single layer made solely of the naphtholactam derivative that is a fluorescent material or a laminate thereof. The thickness of the optically functional layer 120 or the optically functional substrate 105 is decided as appropriate to the intended use and the like. The thickness of the optically functional layer 120 is preferably chosen from the range of, but not limited to, from 0.1 to 100 µm, and that of the optically functional substrate 105 is preferably chosen from the range of, but not limited to, from 10 to 10000 µm. The naphtholactam derivative may be incorporated in an optical filter in the form of a filler, a sealant, an adhesive, or the like.

The optically functional layer 120 or the optically functional substrate 105 is prepared by forming a coating layer on a permanent or temporary substrate by, for example, evaporation deposition, sputtering, solution processes using a solvent (solution or dispersion), such as dip coating, air knife coating, curtain coating, roller coating, wire bar coating, gravure coating, and spin coating, or extrusion.

Examples of the solvent include, but are not limited to, water, alcohols, diols, ketones, esters, ethers, aliphatic or alicyclic hydrocarbons, aromatic hydrocarbons, cyano-containing hydrocarbons, and halogenated aromatic hydrocarbons.

The optically functional layer 120 or the optically functional substrate 105 may be a self-supporting film that may be directly molded from a mixture of the naphtholactam derivative of general formula (I) and a polymer by extrusion, casting, or calendering. Examples of useful polymers include cellulose esters, such as diacetyl cellulose, triacetyl cellulose, propionyl cellulose, butyryl cellulose, acetylpropionyl cellulose, and nitrocellulose; polyamides; polycarbonates; polyesters, such as polyethylene terephthalate, polyethylene naphthalate, polybutylene terephthalate, poly-1,4-cyclohexanedimethylene terephthalate, polyethylene-1,2-diphenoxyethane 4,4'-dicarboxylate, and polybutylene terephthalate; polystyrene; polyolefins, such as polyethylene, polypropylene, and polymethylpentene; acrylic resins, such as polymethyl methacrylate; polysulfones; polyether sulfones; polyether ketones; polyether imides; polyoxyethylene; and norbornene resins.

The optically functional layer 120 or the optically functional substrate 105 may also be prepared by mixing the naphtholactam derivative of general formula (I) with a photocuring resin and/or a thermosetting resin and a photopolymerization initiator and/or a thermal curing agent and applying light and/or heat to form a cured film.

In the case where the optical filter of the invention is for applications involving patterning by wet etching, a cured film may be prepared from a composition containing the naphtholactam derivative of general formula (I) and a photocuring or photo- and thermal-curing resin (i.e., resist). A cured product of the photocuring or photo- and thermal-curing resin (resist) will function as a binder of the optical filter after patterning. To facilitate smooth patterning, the photocuring or photo- and thermal-curing resin is desirably soluble in an organic solvent or an alkali solution in an unexposed state. Examples of useful photocuring or photo- and thermal-curing resin (resist) include (1) a composition containing a polyfunctional acrylic monomer/oligomer having at least two acryloyl or methacryloyl groups and a photo- or thermal polymerization initiator, (2) a composition containing a polyvinyl cinnamate and a sensitizer, (3) a composition containing an acyclic or cyclic olefin and a bisazide (nitrene is generated to crosslink the olefin), and (4) a composition containing an epoxy-containing monomer and an acid generator. The composition (1) that contains a polyfunctional acrylic monomer and oligomer and a photo- or thermal polymerization initiator is particularly preferred; for it is capable of high definition patterning and, after polymerization and cure, provides high reliability in terms of, e.g., solvent resistance and heat resistance.

In the cases where the optically functional layer 120 or the optically functional substrate 105 is designed to function as a light absorbing layer, it is desirable to use the naphtholactam derivative of general formula (I) usually in an amount of 10 to 10000 mg, preferably 100 to 3000 mg, per square meter of the optical filter. Using that amount of the naphtholactam derivative produces a sufficient light absorption effect while maintaining an appropriate optical density to achieve both good display quality and brightness.

In the cases where the optically functional layer 120 or the optically functional substrate 105 is designed to function as a color conversion layer, too, it is desirable to use the naphtholactam derivative of general formula (I) usually in an amount of 10 to 10000 mg, preferably 100 to 3000 mg, per square meter of the optical filter. Using that amount of the naphtholactam derivative produces a sufficient color conversion effect and, in application to the color-converting light-emitting device of the invention or the photoelectric device of the invention, provides adequate color conversion efficiency and photoelectric conversion efficiency. In order to obtain the desirable amount of the naphtholactam derivative as described, it is preferable to form the optically functional layer 120 or the optically functional substrate 105 with a thickness falling within the range described supra by using a resin composition containing, for example, 0.001 to 10 parts by mass of the naphtholactam derivative per 100 parts by mass of a binder resin, while depending on the type of the binder resin used. The same applies to the cases where the optically functional layer 120 or the optically functional substrate 105 is designed to function as a light absorbing layer.

The antireflective layer 130 is provided to prevent reflection on the optical filter of the invention to improve the transmittance. The antireflective layer 130 may be a low refractive index layer formed of a material having a lower refractive index than the substrate 100. The refractive index of such a low refractive index layer is preferably 1.20 to 1.55, more preferably 1.30 to 1.50. The thickness of the low refractive index layer is preferably 50 to 400 nm, more preferably 50 to 200 nm The low refractive index layer may be a layer made of a fluoropolymer with a low refractive index, a layer formed by a sol-gel process, or a layer containing particles. The low refractive index layer containing particles has interparticle or intraparticle microvoids. The porosity of the layer containing particles is preferably 3% to 50% by volume, more preferably 5% to 35% by volume.

The antireflective layer 130 may be formed of a laminate of one or more low refractive index sublayers and one or more medium or high refractive index sublayers to prevent reflection of light of broader wavelength range. The refractive index of a high refractive index sublayer is preferably 1.65 to 2.40, more preferably 1.70 to 2.20. The refractive index of a medium refractive sublayer is set to be the intermediate between the refractive indices of the low and the high refractive sublayers and preferably ranges from 1.50 to 1.90, more preferably from 1.55 to 1.70. The thickness of the medium or high refractive index sublayer is preferably 5 nm to 100 µm, more preferably 10 nm to 10 µm, even more preferably 30 nm to 1 µm. The medium or high refractive index sublayer preferably has a haze of 5% or less, more preferably 3% or less, even more preferably 1% or less, unless it is functionalized for antiglare as described infra.

The medium and the high refractive index sublayers are formed by using polymer binders having relatively high refractive indices, such as polystyrene, styrene copolymers, polycarbonates, melamine resins, phenol resins, epoxy resins, and polyurethanes obtained by the reaction between a cyclic (alicyclic or aromatic) isocyanate and a polyol. Polymers having a cyclic (aromatic, heterocyclic or alicyclic) group and polymers having a halogen atom except fluorine as a substituent also have high refractive indices. Polymers may be formed from monomers having a double bond introduced therein and thereby capable of radical polymerization.

Fine inorganic particles may be dispersed in the above recited polymer binders to increase the refractive index. Inorganic particles having a refractive index of 1.80 to 2.80 are used preferably. Such inorganic particles are preferably prepared from metal oxides or sulfides, such as titanium oxide (including rutile, rutile/anatase mixed crystals, anatase, and amorphous oxide), tin oxide, indium oxide, zinc oxide, zirconium oxide, and zinc sulfide. Preferred of them are titanium oxide, tin oxide, and indium oxide. The inorganic particles may contain the metal oxide or sulfide as a major component and other elements. The term "major component" means a component present in the particles at the highest weight percentage. Other elements that may be present include Ti, Zr, Sn, Sb, Cu, Fe, Mn, Pb, Cd, As, Cr, Hg, Zn, Al, Mg, Si, P, and S. The medium or high refractive index sublayer may also be formed by using inorganic materials that are liquid per se or dispersible in a solvent and are capable of forming a film, such as alkoxides of various elements, salts of organic acids, coordination compounds having a coordinating compound bonded (e.g., chelate compounds), and inorganic active polymers.

The surface of the antireflective layer 130 may be endowed with an antiglare function for scattering incident light thereby preventing the surrounding environment from reflecting on the antireflective layer. An antiglare function can be imparted to the antireflective layer 130 by, for example, finely texturing the surface on which the antireflective layer 130 is to be formed (e.g., the surface of the primer layer 110) or embossing or otherwise roughening the surface of the antireflective layer 130. The antireflective layer 130 functionalized for antiglare usually has a haze of 3% to 30%.

The hardcoat layer 140 is provided to protect the underlying layer(s) (i.e., the optically functional layer 120 and/or the antireflective layer 130) and formed of a material having higher hardness than the substrate 100. The hardcoat layer 140 preferably contains a crosslinked polymer. The hardcoat layer 140 may be formed using acrylic, urethane or epoxy polymers, oligomers or monomers, such as UV curing resins. The hardcoat layer 140 may also be made of a silica-based material.

The lubricating layer 150 may be provided on the surface of the optical filter of the invention. The lubricating layer 150 imparts slip properties to the surface of the optical filter thereby improving scratch resistance. The lubricating layer 150 may be formed using an organopolysiloxane (e.g., silicone oil), a natural wax, a petroleum wax, a higher fatty acid metal salt, or a fluorine-containing lubricant, or a derivative thereof. The lubricating layer 150 preferably has a thickness of 2 to 20 nm.

The primer layer 110, the antireflective layer 130, the hardcoat layer 140, and the lubricating layer 150 may be formed by any wet processes known in the art, such as dip coating, air knife coating, curtain coating, roller coating, wire bar coating, gravure coating, and extrusion coating. When the hardcoat layer 140 is formed from a silica-based material, it may be formed by any film formation techniques known in the art, such as evaporation deposition, sputtering, CVD, and laser ablation.

The layers composing the optical filter may be formed sequentially, or two or more of them may be formed by simultaneous application.

Figure 2:
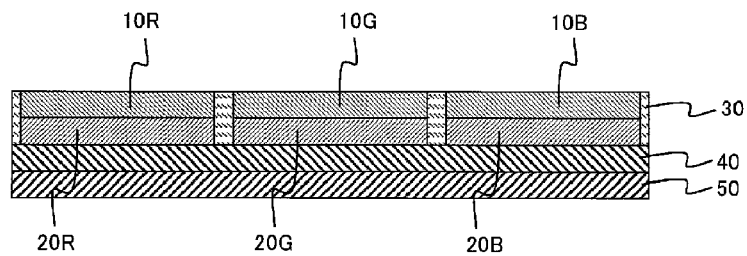
FIG. 2 is a cross-section of a preferred embodiment of a color-converting light-emitting device having the optical filter of the invention which is a color conversion filter.

The color-converting light-emitting device according to the invention is not particularly limited as long as it includes a light emitting portion (light source) and, as a color conversion portion, the color conversion filter of the invention. Otherwise, it may be identical to conventional color-converting light-emitting devices. A preferred embodiment of the color-converting light-emitting device for, for instance, color display is illustrated in FIG. 2. The color-converting light-emitting device of FIG. 2 includes a substrate 50 and a light emitting layer 40 on the substrate 50. The means for causing the light emitting layer 40 to emit light is not particularly limited. For example, a light emitting layer of an EL device is caused to emit light by applying an electric current between electrodes having the light emitting layer therebetween.

A red color-conversion layer 20R, a green color-conversion layer 20G, and a blue color-conversion layer 20B are provided on the light emitting layer 40 to convert the color of the light emitted from the light emitting layer 40. At least one of these color conversion layers is the color conversion filter of the present invention. The color conversion filter may be the red, green, or blue color-conversion layer 20R, 20G, or 20B according to the wavelength after conversion. The color conversion layer may be a color conversion filter formed of a film obtained from a resin composition in which the naphtholactam derivative of general formula (I) is dissolved or dispersed in a binder resin.

If appropriate, a red, a green, and a blue color filter layer 10R, 10G, and 10B may be provided. These color filter layers are provided where it is required to optimize the chromatic coordinate or purity of the light converted through the red, green, and blue color conversion layers 20R, 20G, and 20B, respectively.

The substrate 50 may be of an inorganic material such as glass or the synthetic polymer described with respect to the material of the substrate 100 of the optical film. To facilitate forming electrodes that cause the light emitting layer 40 to emit light, a glass substrate is preferred.

The color filter layers 10R, 10G, and 10B have a function to transmit only light rays of desired wavelengths. The color filter layers 10R, 10G, and 10B are effective in blocking light rays from the light source that remain unconverted and improving the chromatic purity of the light rays having passed through the color conversion layers 20R, 20G, and 20B. These color filter layers may be formed of, for example, the materials of color filters for LCDs.

A color-converting light-emitting device for color display can be formed by arranging a plurality of sets of pixels in a matrix arrangement on a substrate, each set comprising the R, G, and B color-converting light-emitting elements illustrated in FIG. 2. The pattern of arrangement of the color conversion layers depends on the intended use of the device. A red, a green, and a blue pixel having a rectangular, a circular, or any shape intermediate therebetween make one set, and the sets may be arranged in a matrix on the entire surface of a transparent substrate. Or, color conversion layers of two different colors may be arranged in finely partitioned sections in an appropriate area ratio to display a monochromatic color that is not achieved with a color conversion layer of single color.

While FIG. 2 shows an embodiment in which a red, a green, and a blue color conversion layer are used, when a light emitting element that emits blue light is used as a light source, a color filter layer may be used alone without a color conversion layer for blue.

Any light source that emits light in the near ultraviolet to visible region, preferably the near ultraviolet to bluish green region may be used as the light emitting portion. Examples of such a light source include an organic EL device, a plasma light emitting device, a cold-cathode fluorescent lamp, a discharge lamp (e.g., a high pressure or ultrahigh pressure mercury lamp or a xenon lamp), and an LED.

When the color-converting light-emitting device of the invention has color filter layers as illustrated in FIG. 2, the light emitting portion is disposed on the side of the color conversion layer.

When the color-converting light-emitting device of the invention has no color filter layer and uses, for example, the optical filter shown in FIG. 1 (which contains no color filter layer) as a color conversion portion, the light emission portion may be disposed on either side of the optical filter. The optical filter may be stacked directly on the surface of the light source.

Figure 3:
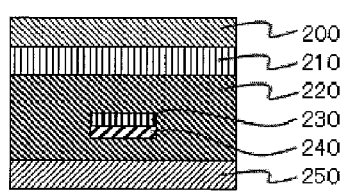
FIG. 3 is a cross-section of a preferred embodiment of a photoelectric device having the optical filter of the invention which is a color conversion filter.

The photoelectric device according to the invention is not particularly limited as long as it includes a photoelectric element and the color conversion filter of the invention. Otherwise, it may be identical to conventional photoelectric devices. A solar cell as a preferred embodiment of the photoelectric device of the invention is illustrated in FIG. 3. In order for a photoelectric element 240 to generate electricity at high efficiency, the neighboring layers including a topsheet layer 200, a transparent substrate 210, a filler layer 220, a light collecting film 230, and a backsheet layer 250 can be made into a color conversion filter. That is, the effects of the optical filter of the invention are obtained by incorporating the naphtholactam derivative of general formula (I) into the element(s) near the photoelectric element. In addition to the above described layers shown in FIG. 3, a color conversion filter layer may separately be provided to obtain the same effects. For example, a color conversion filter layer may be formed of an adhesive containing the naphtholactam derivative of general formula (I) between the above described layers to give the effects of the optical filter of the invention The photoelectric device of the invention is exemplified by, but not limited to, solar cells, including silicon solar cells, such as single crystalline, polycrystalline, or amorphous silicon solar cells; compound solar cells, such as GaAs, CIS, $Cu_2ZnSnS_4$, or CdTe—CdS solar cells; and organic solar cells, such as dye sensitized solar cells and organic thin film solar cells.

EXAMPLES

The present invention will now be illustrated in greater detail with reference to Preparation Examples, Examples, Comparative Examples, and Evaluation Examples, but it should be understood that the invention is not construed as being limited thereto.

Preparation Examples 1

Preparation of Compound No. 1

In a reactor were charged 0.3 mol of 1,8-naphthalic anhydride, 0.3 mol of hydroxylamine hydrochloride, and 330.64 g of pyridine and heated while stiffing. The reaction was conducted under reflux for 1 hour, followed by cooling to 80° C. To the reaction system was added 0.6 mol of p-toluenesulfonyl chloride in power form. After the addition, the temperature was raised, and the reaction was carried out under reflux for 1 hour, followed by cooling. The reaction mixture was poured into 1.25 L of water and stirred to precipitate crystals, which were collected by filtration. The crystals were transferred to a beaker and washed successively with 1 L of a sodium hydrogencarbonate aqueous solution and 1 L of ion exchanged water, followed by filtration. The crystals were washed with ion exchanged water and dried to give an intermediate in a yield of 81.1%. The whole amount of the intermediate, 175 ml of ethanol, and 200 ml of water were put in a reactor and stirred. To the mixture was added dropwise 325 ml of a 2.70 mol/l aqueous solution of sodium hydroxide. Thereafter, the mixture was heated to refluxing temperature, at which the reaction was carried out for 3 hours while distilling off ethanol. After completion of the reaction, the reaction mixture was cooled to 75° C., and 105 ml of concentrated hydrochloric acid was added thereto dropwise. In the meantime, crystals precipitated at 60° C. After completion of the dropwise addition, the mixture was further cooled. The thus precipitated crystals were collected by filtration, washed with ion exchanged water, and dried to give 38.67 g (yield: 94.0%) of the title compound.

Preparation Example 2

Preparation of Compound No. 2

A reactor was charged with 0.08 mol of compound No. 1, 0.40 mol of potassium carbonate, and 73.28 g of dimethylformamide, and 0.096 mol of methyl iodide was added thereto dropwise. The mixture was heated up to 95° C., at which it was stirred for 3 hours. After cooling to 70° C., 100 ml of ion exchanged water and 50 ml of ethyl acetate were added to the reaction mixture, followed by allowing to cool to room temperature. The reaction mixture was extracted with ethyl acetate, and the organic layer was washed with water and freed of the solvent to give 11.12 g (yield: 75.7%) of the title compound.

Preparation Example 3

Preparation of Compound Nos. 3 and 4

A solution of 0.05 mol of compound No. 2 in 131.06 g of dichloromethane was cooled to −30° C., and 0.055 mol of 2,4,4,6-tetrabromo-2,5-cyclohexadiene was added thereto dropwise. Three hours later, the temperature was returned to room temperature, and the mixture was stirred overnight. While cooling in an ice bath, 100 ml of a 0.85 mol/l aqueous solution of sodium hydroxide was added dropwise thereto. The reaction mixture was extracted with chloroform, and the organic layer was washed with water and the solvent removed. The extract was purified by silica gel column chromatography to afford 9.96 g of compound No. 3 and 1.54 g of compound No. 4.

Preparation Example 4

Preparation of Compound No. 5

In a reactor were put 1.00 mmol of compound No. 3, 1.05 mmol of diphenylamine, 1.40 mmol of sodium t-butoxide, and 3 ml of toluene and placed under an argon atmosphere. To the mixture were added 0.15 mmol of $Pd_2(dba)_3$ and 0.50 mmol of biphenyl-2-yl-di-t-butylphosphine were added thereto, followed by stirring at 100° C. for 17 hours. The reaction mixture was extracted with toluene, the organic layer washed with water, and the solvent removed. The extract was purified by silica chromatography to give 0.03 g (yield: 8.3%) of the title compound.

Preparation Example 5

Preparation of Compound No. 6

A reactor was charged with 2.00 mmol of ethyl acetate, 2.90 g of a 28% sodium methoxide solution in methanol, 5.00 mmol of compound No. 3, and 0.70 mol of copper iodide, followed by refluxing for 8 hours. The reaction mixture was extracted with ethyl acetate, the organic layer washed with water, and the solvent removed. The resulting extract was purified by silica column chromatography to give 0.62 g (yield: 58.2%) of the title compound.

Preparation Example 6

Preparation of Compound No. 7

In a reactor were put 2.00 mmol of compound No. 3, 4.00 mmol of diphenylamine, 2.80 mmol of sodium t-butoxide, and 6 ml of toluene and placed under an argon atmosphere. To the mixture were added 0.30 mmol of $Pd(OAc)_2$ and 0.10 mmol of tri-t-butylphosphine, and the mixture was stirred at 100° C. for 8 hours. The reaction mixture was extracted with toluene, the organic layer washed with water, and the solvent removed. The extract was purified by silica chromatography to give 0.06 g (yield: 9.7%) of the title compound.

Preparation Example 7

Preparation of Compound No. 172

In a reactor were charged 5.00 mmol of compound No. 1, 10.00 mmol of potassium hydroxide, 0.20 mmol of tetrabutylammonium bromide, and 9.6 g of tetrahydrofuran. To the mixture was added dropwise 6.00 mmol of 1-bromomethyl-2,3,4,5,6-pentafluorobenzene while stirring, and the mixture was heated to 80° C. After stirring for 1 hour, the reaction mixture was cooled to 60° C., and 50 ml of ion exchanged water and 50 ml of ethyl acetate were added, followed by cooling to room temperature. The reaction mixture was extracted with ethyl acetate, the organic layer washed with water, and the solvent removed. The extract was purified by silica gel column chromatography to give 1.16 g (yield: 66.3%) of the title compound.

The compounds obtained in Preparation Examples 1 to 7 were identified by $^1$H-NMR and IR spectrometry. The results of the identification are shown in Tables 1 and 2 below.

TABLE 1

| | $^1$H-NMR | |
|---|---|---|
| | Solvent | Chemical Shift ppm (Multiplicity, Number of Proton) |
| Compound No. 1 | DMSO-d6 | 10.761 (s, 1H), 8.136-8.116 (d, 1H), 7.996-7.979 (d, 1H), 7.781-7.744 (t, 1H), 7.569-7.548 (d, 1H), 7.482-7.442 (t, 1H), 6.973-6.954 (d, 1H) |
| Compound No. 2 | CDCl$_3$ | 8.052-8.031 (d, 1H), 8.000-7.980 (d, 1H), 7.708-7.670 (t, 1H), 7.531-7.510 (d, 1H), 7.473-7.435 (t, 1H), 6.891-6.873 (d, 1H), 3.439 (s, 3H) |
| Compound No. 3 | CDCl$_3$ | 8.053-8.032 (d, 1H), 8.009-7.991 (d, 1H), 7.742-7.704 (t, 1H), 7.594-7.574 (d, 1H), 6.680-6.662 (d, 1H), 3.384 (s, 3H) |
| Compound No. 4 | CDCl$_3$ | 8.125-8.113 (d, 1H), 8.105-8.096 (d, 1H), 7.809-7.771 (t, 1H), 7.736 (s, 1H), 3.705 (s, 3H) |
| Compound No. 5 | CDCl$_3$ | 8.009-7.991 (d, 1H), 7.782-7.762 (d, 1H), 7.530-7.492 (t, 1H), 7.226-7.187 (m, 5H), 7.065-7.045 (d, 4H), 6.976-6.940 (t, 2H), 6.839-6.821 (d, 1H), 3.444 (s, 3H) |
| Compound No. 6 | CDCl$_3$ | 8.228-8.209 (d, 1H), 8.071-8.053 (d, 1H), 7.696-7.658 (t, 1H), 6.757-6.725 (t, 1H), 6.670-6.651 (d, 1H), 3.975 (s, 3H), 3.419 (s, 3H) |
| Compound No. 7 | CDCl$_3$ | 8.331-8.309 (d, 1H), 8.042-8.026 (d, 1H), 8.681-7.643 (t, 2H), 7.060-7.042 (d, 1H), 6.812-6.792 (d, 1H), 3.423 (s, 3H), 2.959-2.944 (d, 4H), 1.916-1.848 (m, 2H), 0.926-0.909 (d, 12H) |

TABLE 1-continued

| | $^1$H-NMR | |
|---|---|---|
| | Solvent | Chemical Shift ppm (Multiplicity, Number of Proton) |
| Compound No. 172 | CDCl$_3$ | 8.093-8.074 (d, 1H), 8.035-8.015 (d, 1H), 7.742-7.704 (t, 1H), 7.559-7.538 (d, 1H), 7.458-7.420 (t, 1H), 6.905-6.886 (d, 1H), 5.215 (s, 2H) |

TABLE 2

| IR absorption spectrum (KBr) | |
|---|---|
| | IR Absorption Spectrum/cm$^{-1}$ |
| Compound No. 1 | 3187, 1727, 1665, 1646, 1496, 1472, 1379, 1260, 1092, 826, 767, 678, 596, 542 |
| Compound No. 2 | 1693, 1635, 1603, 1498, 1473, 1441, 1427, 1392, 1363, 1318, 1278, 1230, 1196, 1036, 1019, 823, 768, 623, 595, 576, 531 |
| Compound No. 3 | 1703, 1632, 1603, 1496, 1469, 1434, 1417, 1396, 1352, 1315, 1265, 1207, 1024, 932, 820, 765, 732, 698, 593, 564, 505 |
| Compound No. 4 | 1710, 1590, 1466, 1428, 1376, 1254, 1016, 859, 764, 733 |
| Compound No. 5 | 1704, 1631, 1589, 1491, 1473, 1277, 1024, 743, 696 |
| Compound No. 6 | 1689, 1635, 1479, 1433, 1281, 1248, 1054, 1028, 821, 775 |
| Compound No. 7 | 2952, 1712, 1629, 1475, 1317, 1279, 1023, 817, 772, 746 |
| Compound No. 172 | 1721, 1707, 1632, 1604, 1520, 1506, 1473, 1400, 1362, 1308, 1120, 1016, 961, 828, 777, 610 |

Examples 1 to 8 and Comparative Examples 1 and 2

Each of the naphtholactam derivatives obtained in Preparation Examples 1 to 7 (compound Nos. 1 through 7 and 172) and comparative compounds 1 and 2 shown below was dissolved in a previously prepared 20 wt % toluene solution of polymethyl methacrylate in a concentration giving an absorbance of 0.5 at $\lambda_{max}$. The solution was applied to a 100 μm thick polyethylene terephthalate film with a wire bar (RDS30, from RDS Webster, N.Y.) and heated in an oven at 100° C. for 10 minutes to make an optical filter of the invention or for comparison. The absorption spectrum of the resulting optical filter was determined using a spectrophotometer U-3010 from Hitachi High-Technologies Corp. The fluorescence spectrum of the filter was determined using a fluorescence spectrophotometer F4500 from Hitachi High-Technologies Corp. Light having a wavelength of the $\lambda_{max}$ of each individual filter was used as exciting light. The quantum efficiency of the filter was determined using a fluorescence spectrophotometer F4500 from Hitachi High-Technologies Corp. and a φ60 integrating sphere. Light having a wavelength near the $\lambda_{max}$ of each individual filter was used as exciting light. The quantum efficiency was calculated from the area ratio. The results are shown in Table 3.

[Chemical Formula 6]

Comparative Compound No. 1

Comparative Compound No. 2

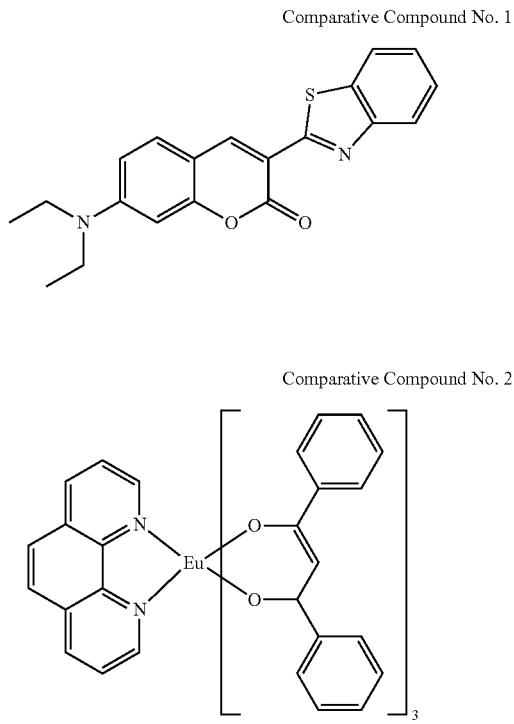

TABLE 3

| Compound Used | $\lambda_{max}$ (nm) | $FL_{max}$ (nm) | Quantum Efficiency (%) | Stokes Shift (nm) |
|---|---|---|---|---|
| Example 1 Compound No. 1 | 353 | 477.6 | 23.2 | 124.6 |
| Example 2 Compound No. 2 | 371 | 498.2 | 18.7 | 127.2 |
| Example 3 Compound No. 3 | 384 | 509.4 | 13.9 | 125.4 |
| Example 4 Compound No. 4 | 383 | 506.2 | 10.5 | 123.2 |
| Example 5 Compound No. 5 | 401 | 545.8 | 1.9 | 144.8 |
| Example 6 Compound No. 6 | 399 | 538.4 | 1.8 | 139.4 |
| Example 7 Compound No. 7 | 416 | — | — | — |
| Example 8 Compound No. 172 | 364 | 483.8 | 30.2 | 119.8 |
| Compara. Example 1 Compound No. 1 | 448 | 495.6 | 31.3 | 47.6 |
| Compara. Example 2 Compound No. 2 | 349 | 611.2 | 8.8 | 262.2 |

Evaluation Example 1

The optical filters obtained in Examples 1 to 8 and Comparative Examples 1 and 2 were irradiated with light for 24 hours using a xenon Weather-O-Meter Table Sun from Suga Test Instruments Co., Ltd. to evaluate light resistance. The absorbance at the absorption maximum wavelength $\lambda_{max}$ of each filter and the fluorescence intensity at the fluorescence maximum wavelength ($FL_{max}$) of the filter were measured before and after the 24-hour irradiation. The value measured after the irradiation was relatively expressed with the initial value (before irradiation) taken as 100 to obtain a retention percentage as a measure of light resistance. The results obtained are shown in Table 4.

TABLE 4

| Optical Filter (Compound Used) | Absorbance Retention after 24 h Irradiation | Fluorescence Intensity Retention after 24 h Irradiation |
|---|---|---|
| Example 1 (compound No. 1) | 96 | 91 |
| Example 2 (compound No. 2) | 99 | 101 |
| Example 3 (compound No. 3) | 97 | 96 |
| Example 4 (compound No. 4) | 100 | 105 |
| Example 5 (compound No. 5) | 100 | 107 |
| Example 6 (compound No. 6) | 101 | 109 |
| Example 7 (compound No. 7) | 100 | — |
| Example 8 (compound No. 172) | 100 | 100 |
| Comp. Example 1 (comp. compound No. 1) | 50 | 9 |
| Comp. Example 2 (comp. compound No. 2) | 7 | 4 |

As is apparent from Table 4, the optical filters of Examples 1 to 8 have excellent light resistance whereas those of Comparative Examples 1 and 2 have poor light resistance.

It is seen from the foregoing that the optical filters of Examples 1 to 6 and 8 have color conversion performance and high light resistance and are therefore suitably applicable to color-converting light-emitting devices and photoelectric devices. Although the optical filter of Example 7 does not have color conversion capability, it is excellent in light resistance and therefore suitable for tone correction.

DESCRIPTION OF NUMERAL REFERENCES

| | |
|---|---|
| 10R: | red filter layer |
| 10G: | green filter layer |
| 10B: | blue filter layer |
| 20R: | red color-conversion layer |
| 20G: | green color-conversion layer |
| 20B: | blue color-conversion layer |
| 30: | black mask |
| 40: | light emitting layer |
| 50: | substrate |
| 100: | substrate |
| 105: | optically functional substrate |
| 110: | primer layer |
| 120: | optically functional layer |
| 130: | antireflective layer |
| 140: | hardcoat layer |
| 150: | lubricating layer |
| 200: | topsheet layer |
| 210: | transparent substrate |
| 220: | filler layer |
| 230: | light collecting film |
| 240: | photoelectric element |
| 250: | backsheet layer |

The invention claimed is:

1. An optical filter comprising at least one naphtholactam derivative represented by general formula (I):

[Chemical Formula 1]

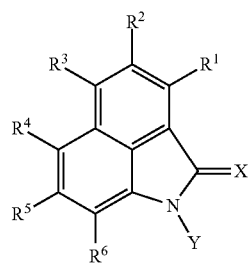

(I)

wherein X represents an oxygen atom or a sulfur atom; $R^1$, $R^2$, $R^3$, $R^4$, $R^5$, $R^6$, and Y each independently represent a hydrogen atom, a halogen atom, a nitro group, a cyano group, an aldehyde group, a carboxyl group, a hydroxyl group, —NRR', an organosilyl group, an optionally substituted alkyl group having 1 to 30 carbon atoms, an optionally substituted aryl group having 6 to 30 carbon atoms, or an optionally substituted arylalkyl group having 7 to 30 carbon atoms; the methylene chain of the alkyl group, the methylene chain of the arylalkyl group, and the bond between the aryl group and the naphtholactam structure is optionally interrupted by —O—, —S—, —SO$_2$—, —CO—, —OCO—, or —COO—; the methylene chain may be —CH=CH— or —C≡C—; and R and R' each independently represent a hydrogen atom, an optionally substituted alkyl group having 1 to 30 carbon atoms, or an optionally substituted aryl group having 6 to 30 carbon atoms.

2. The optical filter according to claim 1, which is a color conversion filter having wavelength conversion performance.

3. A color-converting light-emitting device comprising a light emitting portion and the optical filter according to claim 2.

4. A photoelectric device comprising a photoelectric element and the optical filter according to claim 2.

5. The optical filter according to claim 2, wherein the color conversion filter absorbs light at 300 to 500 nm and emits light at 400 to 700 nm.

6. The optical filter according to claim 1, wherein the optical filter comprises a substrate and an optically functional layer containing the naphtholactam derivative of general formula (I).

7. The optical filter according to claim 6, wherein the optical filter further comprises at least one of a primer layer, an antireflective layer, a hardcoat layer or a lubricating layer.

8. The optical filter according to claim 1, wherein the optical filter comprises a substrate and an optically functional layer, and the naphtholactam derivative of general formula (I) is present in either the substrate or any functional layer.

9. The optical filter according to claim 8, wherein the optical filter further comprises at least one of a primer layer, an antireflective layer, a hardcoat layer or a lubricating layer.

10. The optical filter according to claim 1, wherein the optical filter comprises a substrate formed from glass or a polymer selected from the group consisting of polyethylene terephthalate, polymethyl methacrylate, polyvinyl butyral, polyvinylpyrrolidone, polyvinyl alcohol, polyvinyl chloride, styrene-butadiene copolymers, polystyrene, polycarbonate, polyamide, ethylene-vinyl acetate copolymer resins, epoxy resins, polyfluorene resins, and silicone resins.

11. The optical filter according to claim 10, wherein the substrate has a visible light transmittance of at least 80%.

12. The optical filter according to claim 10, wherein the substrate has a refractive index of 1.45 to 1.70.

13. The optical filter according to claim 10, wherein the substrate has a thickness of 10 to 10000 μm.

14. The optical filter according to claim 1, wherein the optical filter includes a quencher selected from the group consisting of aminium colorants, iminium colorants, cyanine colorants, and transition metal chelate compounds.

15. The optical filter according to claim 1, wherein the optical filter includes a colorant selected from the group consisting of cyanine colorants, pyridine colorants, oxazine colorants, coumarin colorants, coumarin dyes, naphthalimide colorants, pyromethene colorants, perylene colorants, pyrene colorants, anthracene colorants, styryl colorants, rhodamine colorants, azo colorants, quinone colorants, squarylium colorants, diketopyrrolopyrrole colorants, iridium complex colorants, europium complex colorants, phthalocyanine colorants and porphyrin colorants.

16. An optical filter, comprising:
a substrate; and
an optically functional layer,
wherein at least one of the substrate and the optically functional layer contains at least one naphtholactam derivative represented by general formula (I):

[Chemical Formula 1]

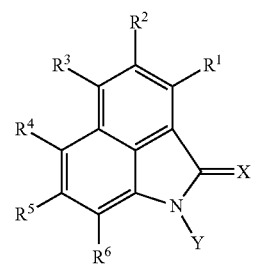

(I)

wherein X represents an oxygen atom or a sulfur atom; $R^1$, $R^2$, $R^3$, $R^4$, $R^5$, $R^6$, and Y each independently represent a hydrogen atom, a halogen atom, a nitro group, a cyano group, an aldehyde group, a carboxyl group, a hydroxyl group, —NRR', an organosilyl group, an optionally substituted alkyl group having 1 to 30 carbon atoms, an optionally substituted aryl group having 6 to 30 carbon atoms, or an optionally substituted arylalkyl group having 7 to 30 carbon atoms; the methylene chain of the alkyl group, the methylene chain of the arylalkyl group, and the bond between the aryl group and the naphtholactam structure is optionally interrupted by —O—, —S—, —SO$_2$—, —CO—, —OCO—, or —COO—; the methylene chain may be —CH=CH— or —C≡C—; and R and R' each independently represent a hydrogen atom, an optionally substituted alkyl group having 1 to 30 carbon atoms, or an optionally substituted aryl group having 6 to 30 carbon atoms.

17. The optical filter according to claim 16, which is a color conversion filter having wavelength conversion performance.

18. A color-converting light-emitting device comprising a light emitting portion and the optical filter according to claim 17.

19. A photoelectric device comprising a photoelectric element and the optical filter according to claim 17.

20. The optical filter according to claim 16, wherein the optical filter further comprises at least one of a primer layer, an antireflective layer, a hardcoat layer or a lubricating layer.

* * * * *